United States Patent [19]
De Palma et al.

[11] Patent Number: 5,966,516
[45] Date of Patent: Oct. 12, 1999

[54] APPARATUS FOR DEFINING PROPERTIES IN FINITE-STATE MACHINES

[75] Inventors: Gary F. De Palma, Branchburg; Arthur Barry Glaser, Watchung, both of N.J.; Robert Paul Kurshan, New York, N.Y.; Glenn R. Wesley, Allentown, Pa.

[73] Assignee: Lucent Technologies Inc., Murray Hill, N.J.

[21] Appl. No.: 08/853,578

[22] Filed: May 9, 1997

Related U.S. Application Data

[60] Provisional application No. 60/017,887, May 17, 1996.

[51] Int. Cl.$^6$ .................................................. G06F 17/00
[52] U.S. Cl. ......................................... 395/500.01
[58] Field of Search ................................ 364/578, 488, 364/489, 490, 491; 395/500

[56] References Cited

U.S. PATENT DOCUMENTS

| | | | |
|---|---|---|---|
| 5,404,319 | 4/1995 | Smith | 364/578 |
| 5,465,216 | 11/1995 | Rotem | 364/488 |
| 5,493,508 | 2/1996 | Dangelo | 364/489 |
| 5,539,680 | 7/1996 | Palnitkov | 364/578 |
| 5,548,539 | 8/1996 | Vlach | 364/578 |
| 5,572,437 | 11/1996 | Rastoker | 364/489 |
| 5,572,712 | 11/1996 | Jamal | 395/500 |
| 5,594,657 | 1/1997 | Cantone | 364/490 |
| 5,734,837 | 3/1998 | Flores | 395/207 |
| 5,740,084 | 4/1998 | Hardin | 364/578 |

OTHER PUBLICATIONS

Goering, Richard, "Formal Verification Tools Tipped at DAC" Elect. Engineering Times, p. 1, Jun. 19, 1995.
Software Magazine, v 15, p. 114, "Template Software, Inc. . . . ", Mar. 1995.
Murdoch, John, "Use Template Forms . . . ", Data Based Advisor, v12, p. 164, Nov. 1994.
Bentley, Jon, "Template Driven Programming" UNIX Review v 12, p. 79, Apr. 1994.

*Primary Examiner*—Kevin J. Teska
*Assistant Examiner*—A. S. Roberts
*Attorney, Agent, or Firm*—James DiGiorgio; Stephen M. Gurey

[57] ABSTRACT

A method and apparatus for defining a system design specification by using a finite set of templates that have a format for accepting a set of system expression such that a selected template, when filled with the system expressions, defines an intended behavioral attribute of the system. In one illustrative embodiment, each template has a set of qualifiers and a set of entry blanks, wherein each qualifier is associated with an entry blank. In such an embodiment, the set of entry spaces may comprise a fulfilling condition entry space for accepting a system expression that defines a required or assumed event of the system model, an enabling condition entry space for accepting a system expression that defines a precondition for starting a check of the required or assumed event, and a discharging condition entry space for accepting a system expression that defines a condition after which said fulfilling condition is no longer required or assumed by the system model. Filling the entry spaces of a selected template with the appropriate system expression can form an expression that defines an intended behavior of the system model. Thus, a set of filled templates can define a set of intended behaviors of the system model (i.e. a system design specification). The system design specification can then be used to generate computer-executable code (e.g. automata) for testing the intended behavioral attributes of the system. For example, each filled template of the system design specification can be converted to an automaton by a given subroutine.

59 Claims, 2 Drawing Sheets

APPARATUS FOR DEFINING PROPERTIES IN FINITE-STATE MACHINES

Claim of Benefit

This invention claims the benefit of U.S. Provisional Application No. 60/017,887, filed May 17, 1996.

FIELD OF THE INVENTION

The present invention relates to computer-aided verification or simulation, and more particularly, to the specification of properties used in verification or simulation systems.

BACKGROUND OF THE INVENTION

A long-standing problem in the design of large-scale, highly complex systems is verifying that the system will behave in the manner intended by its designers. One approach to this problem is to simply try out the system, either by building and testing the system itself or by building and testing a model of the system. Since most new systems require several revisions or redesigns before they behave as intended by the system designer, many system designers choose to first build and test a model of the system. This enables the designer to check the system design by testing the behavior of the system model so that any causes for system redesign can be identified before incurring the expenses associated with building the system itself.

In one method of building and testing a system model, called computer simulation, a designer "builds" the system model by writing a computer program that simulates the intended properties (i.e. functions and features) of the system. The computer program, or system model, is designed to accept inputs, perform functions and generate outputs in the same manner as would the actual system. In computer simulation, the system model is tested by running a checking program which checks how the system model behaves in response to various inputs. Basically, the checking program controls the inputs to the system model, and checks whether the behavior of the model to a given set of inputs is the behavior intended by the system designer. For example, in checking a model of a telephone, a checking program would be operable to control the various telephone model inputs (e.g. AC power level, control signals, and dialed numbers), and monitor the behavior of the telephone model in response to such inputs.

A significant problem with computer simulation, however, is that only the behaviors anticipated by the designer can be checked. That is, the designer can only check those behaviors which the checking program is designed to check. This is a problem because a designer may not posses the system knowledge that is necessary to anticipate or incorporate all of the intended system behaviors into the checking program. Notwithstanding this, even a designer knowledgeable about the system design may find it hard to anticipate some behavioral attributes of a sufficiently complex system. As a result, computer simulation is not always a reliable method of testing the properties (i.e. intended functions and features) of a system design.

As the limitations of simulation have become apparent, interest has grown in another method of building and testing a system model, called formal verification. In formal verification, to test a model of a system, a designer is required to "build" both a system model, which may be the same model used for simulation, and a system design specification. The designer may "build" the system model by writing a computer program or a set of logical expressions that define an implementation of the system, and may "build" the system design specification by writing a set of logical expressions that define the intended behavioral attributes of the system. Basically, the system model is designed to accept inputs, perform functions and generate outputs in the same manner as would the actual system, if built, and the system design specification is designed such that each logical expression defines an intended behavioral attribute of the system or system model.

With a system model and a system design specification, a verification tool can be used to test whether the behavior of the system model is consistent with the intended behaviors defined by the design specification. Often, this is done by converting both the system model and the system design specification into a state machine. The system model state machine can be described as a system or set of states and transitions that reflects or mimics how the system model would behave in response to any given set of inputs. The system design specification state machine can be described as a system or a set of states and transitions that defines how the designer intends or expects the system model to act in response to a given set of inputs. For example, the design specification state machine might define which states the system model state machine may enter (i.e. "good" states) and may not enter (i.e. "bad" states) during operation, when given a certain set of inputs. Thus, to test whether the system model behaves according to the expected behaviors defined in the design specification, the verification tool would control and/or vary the inputs to the system model state machine and check whether the system model state machine can possibly enter any states defined by the design specification state machine as "bad" states. If so, the system design is said to fail the system design specification, and a system redesign may be in order.

Thus, it is clear that the accuracy and reliability of a formal verification system directly depends on the accuracy of the designer in writing the logical expressions that define the system design specification. If the logical expressions do not accurately define the intended behaviors of the system, the design specification state machine will not accurately define which states the system model state machine may and may not enter, given a set of inputs. Moreover, if the design specification state machine fails to accurately define the bad states, then any formal verification test will fail to check the system model for the intended behavior. Thus, the reliability of formal verification ultimately depends on the accuracy of the designer in writing the logical expressions that define the system design specification.

Heretofore, when writing the logical expressions that define a system design specification, designers are literally faced with the task of working from a blank page. That is, the designers must decide how to express each intended behavioral attribute beginning with a blank page and a set of logical operators. To illustrate, most present day designers use temporal logic to write the required logical expressions. A temporal logic expression can be generated by using a set of temporal logic operators which may include "G" meaning "at every state", "F" meaning "eventually", "A" meaning "along all state transition executions, "~" meaning "not", V meaning "or", and "→" meaning "implies." Thus, to generate a logical expression that defines a given intended behavioral attribute of the system, the designer must understand the logical meaning of each operator, decide which operators to use, and decide how to associate the chosen operators with the appropriate system variables or system parameters to ultimately form an expression of the behavior being defined.

For example, temporal logic can be used to express a behavioral attribute such as turning on an oven when a temperature goes below a certain value. One temporal logic designer may express this behavior as AG(t→AF(~p ∨ w)), where the parameter "t" means the temperature goes below the stated value, "p" means the oven is powered, and "w" means the oven is turned on. Another designer, however, may decide that this behavior could be expressed in temporal logic as G(t→F(w)), wherein the parameters "t" and "w" are the same as described above. Although each expression may appear to its respective designer as accurately defining the system behavior, the expressions do not have the same logical meaning and thus do not define the same system behavior. As a result, it is very possible that different designers can write completely different logical expressions for defining the same system property, with one logical expression not actually defining the same intended behavior as the other. Thus, unless the designer posses both a detailed knowledge of the system design and a high level of skill in the logic being used to define the design specification, use of conventional formal verification tools to test a system design can be quite difficult and unreliable.

SUMMARY OF THE INVENTION

According to the present invention, a designer can accurately define a system design specification through a finite set of templates. The finite set of templates provide a relatively small number of easy to understand expressions that greatly simplify, clarify and make more reliable the undertaking of defining a design specification. In general, each template has a set of entry spaces for accepting a set of system expressions. Each system expression, which is written in terms of system model variables, defines a condition or "actual value" of the system model. When such a set of system expressions are accepted into the entry spaces of a template, the "filled" template forms a logic expression that defines an intended behavioral attribute of the system. Thus, a design specification can be easily defined by selecting an appropriate template for each intended behavior of the system, and inputting the relevant system expressions in the entry spaces of the selected templates.

In one illustrative embodiment, each entry space of each template has an associated qualifier that acts as a logic operator. Thus, to define an intended behavioral attribute of the system the designer must first select a template, from the finite set of templates, that has a set of qualifiers and associated entry spaces that the designer believes can be used to form a logical expression that best defines the intended behavioral attribute. Once the appropriate template is selected, the designer can enter the system expressions into the entry spaces to "fill" the template. The resultant "filled" template forms a logical expression that defines the intended behavioral attribute.

An example of a template having a set of qualifiers and entry spaces is "AFTER( )EVENTUALLY( )." This template has the set of qualifiers "AFTER" and "EVENTUALLY," and the set of entry spaces represented by the brackets "( )." This template can be used to define an intended system behavior such as turning on an oven when the temperature falls below 30 degrees Celsius. To do this, the designer would simply enter the relevant system expressions, in terms of the system model variables, into the entry spaces. For example, in a system model wherein the expression "t" means "the temperature is less than 30 degrees Celsius" and wherein the expression "w" means "the oven is on," the designer would simply enter the expression "t" in the entry space associated with the qualifier "AFTER," and enter the expression "w" into the entry space associated with the qualifier "EVENTUALLY." The resultant "filled" template, "AFTER(t)EVENTUALLY(w)," forms a logical expression which defines the behavior: "after the temperature is less than 30 degrees Celsius, then eventually the oven is on." As can be seen, the qualifiers "AFTER" and "EVENTUALLY" take on their intuitive meaning in the English language, thus making the meaning of each template easier to understand than the above described temporal logic expressions.

In an illustrative embodiment, a designer can select the appropriate templates and enter the relevant system expressions through query screens. The query screens can be presented to the designer through a graphical interface in the form of a set of screens that provide the designer with the means to peruse the finite set of templates and select the appropriate template for defining a given behavioral attribute, and the means to "fill" the selected template with the relevant system expressions.

Advantageously, the present invention eliminates the need for a highly skilled designer to write numerous and/or complex logic expressions required to define system design specification for use in prior art verification and simulation tools. Thus, the present invention overcomes, to some extent, the limitations of the prior art. These and other features of the invention will become more apparent in view of the detailed description of illustrative embodiments when taken with the drawings. The scope of the invention, however, is limited only by the claims attached hereto.

DETAILED DESCRIPTION OF ILLUSTRATIVE EMBODIMENTS OF THE INVENTION

Figures 1, 2:
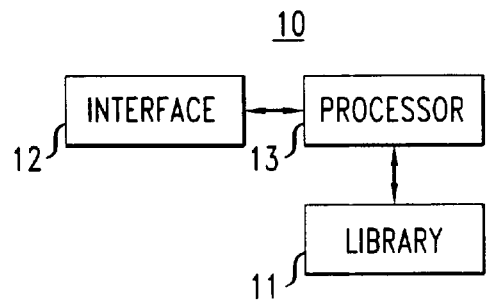
FIG. 1 is block diagram of an illustrative embodiment of an apparatus for defining a design specification of a system, according to the present invention.
FIG. 2 is a pictorial view of an illustrative embodiment of a template.

Referring now to FIG. 1 there is shown a block diagram of an illustrative embodiment of an apparatus for defining a design specification of a system, according to the present invention, hereinafter referred to as apparatus 10. As shown, apparatus 10 has a processor 13 electrically coupled to an interface 12 and a library 11. Interface 12 can be a standard graphical interface, including a monitor and a keyboard. Library 11, which can be an electronic storage medium such as a read only memory, contains a finite set of templates.

The finite set of templates provide a relatively small number of easy to understand expressions that greatly simplify, clarify and make more reliable the undertaking of defining a design specification. Each template has a set of entry spaces for accepting a set of system expressions related to the system for which an intended behavioral attribute is being defined. When such a set of system expressions are accepted into a selected template, the "filled" template forms a logic expression that defines the intended behavioral attribute of the system. Thus, a design specification can be easily defined by selecting an appropriate template for each intended behavior of the system, and inputting the relevant system expressions in the template entry spaces.

Referring now to FIG. 2 there is shown a one illustrative embodiment of a query screen that provides a designer with a means for selecting and "filling" templates to define system behavioral attributes, hereinafter referred to as query screen 20. As shown, query screen 20 provides an entry space 21 for naming the behavior being defined, and a selection bar 22 that provides the designer with a means for selecting a type of behavior being defined. The name entered in entry space 21 can be any name the designer wishes to use when defining an intended behavior of the system. The selected behavior type 22, however, depends on which set of qualifiers that the designer determines are required to express the intended behavioral attribute. As shown, when the designer determines that the system behavioral attribute being defined requires a template with "EVENTUALLY" as one of the fulfilling qualifiers, then the designer can select the "EVENTUALLY" behavior type.

Once the designer enters the behavior name (e.g. OVEN) and selects the behavior type (e.g. EVENTUALLY), a window (not shown) that lists those of the finite set of templates which have "EVENTUALLY" as one of the qualifiers is presented through screen 20 to the designer. The designer can then select, from the finite set of templates, the template having the appropriate format for defining the intended behavior. Once the appropriate template is selected, query screen 20 presents the template qualifiers 26 and 27 and their associated entry spaces 23 and 24, as shown. The designer can then enter the appropriate system expressions, written in terms of system model variables (e.g. "t" and "w"), in the entry spaces to fill the template.

As shown, the system expression "t" which is defined in the system model as representing the mathematical expression "temp<30," where "temp" is a system model variable for temperature, is entered into entry space 23, whereas the system expression "w," which is defined in the system model as representing the mathematical expression "the oven is on," is entered into entry space 24. The filled template has the form "AFTER(t) EVENTUALLY (w). In using the above described symbol definitions, this expression means: "after the temperature falls below 30 degrees Celsius, the system should eventually turn on the oven." Thus, through query screen 20, the designer can easily define such intended system behaviors.

Similarly, by repeating the process just described for a set of behavioral attributes of a system model, query screen 20 can be used to define a system model design specification. The system model design specification can be used to generate computer-executable code for testing the intended behavioral attributes of the system. For example, the set of filled templates can be converted to automata, i.e. a state transition system having certain sequential states which serve to distinguish between acceptable and unacceptable behaviors, by a set of subroutines. Thus aspect of the invention will be discussed in greater detail below.

The format of query screen 20 is just an illustrative example of one method for enabling a designer to select and fill a template to define a behavioral attribute. In another embodiment of the present invention, a query screen having another format may be used. For example, the query screen may have a format that enables a designer to search a finite set of templates, without having to enter a behavior type 22. And, the query screen may enable the designer to select an option that initiates the retrieval of system expressions from an electronic storage medium to fill the entry spaces of the selected template.

Thus, considering the operation of apparatus 10 in greater detail, it will be appreciated that apparatus 10 can be used to define a design specification for a system having a set of intended behavioral attributes. To illustrate, processor 13 can present the finite set of templates from library 11 to a designer, through interface 12. The designer can then select, for each system behavioral attribute, a template having a set of qualifiers and associated entry spaces that provides the means to best express the system behavioral attribute. Once a template is chosen for expressing a given system behavioral attribute, processor 13 can query the designer to enter the appropriate system expressions into the entry spaces of the template. The resultant "filled" template is a logic expression, composed of a set of qualifiers and associated system expressions, that defines the given system behavioral attribute. As a result, the designer can repeat the process for a set of system behavioral attributes to ultimately define a system design specification.

To illustrate, system 10 can be used to define an intended behavioral attribute of a system that, among other things, turns on an oven when a temperature falls below 30 degrees Celsius. To define this intended behavioral attribute, a designer can peruse the finite set of templates and identify a template having a set of qualifiers and associated entry spaces (i.e. a template format) which the programmer believes can best express or define the intended behavioral attribute. To identify such a template, the programmer can first decide on the general template format (i.e. set of qualifiers and entry spaces) that can be used to express or define the behavior of turning on an oven under the stated conditions. That is, the programmer may simply write a concise English statement of the behavioral attribute and extract from that concise statement a general template format that can be used to define the behavior.

For example, in choosing a template to express or define the above described behavior, the designer may first write the statement: "After the temperature goes below 30 degrees Celsius, eventually the oven is turned on." From this simple statement, the designer can decide that the general form of a template for expressing this behavior is "AFTER (the temperature goes below 30 degrees Celsius) EVENTUALLY (the oven turns on)," wherein "AFTER" and "EVENTUALLY" qualify the associated conditions "the temperature goes below 30 degrees Celsius" and "the oven turns on," respectively. With this general template format, the designer can peruse the finite set of templates and identify a template having a matching format. Once the appropriate template is selected, the designer can enter or "fill" the template with the appropriate details (i.e. the system expressions) specific to the system behavioral attribute being defined.

Of course, in formulating the English language prototype, the designer needs to bear in mind the set of available templates. For this reason, it is important that the finite set of templates be a small set. On the other hand, it would be useful for the designer to know that the given set of templates suffice to express all properties that could be expressed with such templates. It would therefore be useful, but not essential, to have a finite set of templates that is "complete" in the sense that there exists no additional template that is not in the set which could express a property not already expressible with templates already in the set.

In the current example, the designer may peruse library 11 and find a template having the format "AFTER(enabling condition)EVENTUALLY(fulfilling condition)", where "enabling condition" is a system expression that defines a precondition for starting a check of a "fulfilling condition" which defines an event required by a system behavioral attribute. If such a template is found and selected, the designer may use interface 12 to "fill" the entry spaces of the selected template with the appropriate system expressions stated above. The resultant "filled" template would then be "AFTER (t) EVENTUALLY (w), wherein "t" is a system expression (e.g. a Boolean expression) that means "the temperature is below 30 degrees Celsius," and "w" is a system expression (e.g. a Boolean expression) that means "the oven is turned on." In taking the intuitive meaning of the qualifier "AFTER" and "EVENTUALLY" of the selected template, the resultant "filled" template is easily understood to define the behavior "after the temperature falls below 30 degrees Celsius, then eventually the oven must turn on." From this example, it can be seen that the present invention can be used to define a set of system behavioral attributes, and thus define a system design specification. That is, each behavioral attribute of a system can be defined by selecting the appropriate template, from the finite set of templates, and inputting the appropriate system expressions (e.g. Boolean expressions) to form a set of "filled" templates that define a system design specification.

It should be noted that, in an illustrative embodiment of the invention, the behavioral attributes of a system can be expressed as properties and/or constraints, wherein a property is a function or feature of the system, and a constraint is an assumption about the operation of the system due to the system environment. That is, under some testing conditions, it may be required that both a property and a constraint be used to define an intended behavior. For example, in the above described system, the behavioral attribute of turning on an oven may be predicated on the requirement that the design retains power over a sufficiently long period of time.

When defining a design specification for such a system, the designer may select a first template to define the function of turning on an oven under the given conditions, and a second template to define the condition that the oven is assumed to always be sufficiently powered. The combination of the first and second template can be used to test the system model function of turning on an oven, while eliminating the possibility that the behavior of the oven will be deemed to have failed only because the system model was not powered-up for a sufficiently long period of time. In such an embodiment, the first template can be called a property template because it is used to define a function or feature of the system (i.e. system property), whereas the second template can be called a constraint template because it is used to place a limit on the testing environment of the system (i.e. system constraint). The property template and constraint template can be chosen and "filled" as described above.

To illustrate, the designer can first select and fill-in the template having the format "AFTER(enabling condition) EVENTUALLY(fulfilling condition)" with the appropriate system expressions to define the intended property of turning on an oven. The resultant property template would be AFTER(t)EVENTUALLY(w), as described above. Then, the designer can select, from the finite set of templates, a second template for defining the above described system constraint. For example, the designer can select a template having the format ASSUMEALWAYS(fulfilling condition) wherein the fulfilling condition is the condition that the system is sufficiently powered. Once the template having such a format is chosen, the designer simply fills in the entry space, for the fulfilling condition, a system expression, written in terms of system variables, that describe the fulfilling condition.

In one embodiment, wherein "p" is a system expression representing, if true, the condition that the system is sufficiently powered, the resulting constraint template would be ASSUMEALWAYS(p). In such an embodiment, the combination of the filled property template, AFTER(t) EVENTUALLY(w), and the filled constraint template, ASSUME ALWAYS(p), defines the intended behavioral attribute of turning on the oven when the temperature falls below 30 degrees Celsius, assuming that the system model was powered-up for a sufficient amount of time. Thus, by combination of the property template and the constraint template, just described, into the design specification, the designer eliminates the possibility that a test of the system model oven functionality will report a failure due to insufficient system power. Thus, it can be seen that by separating the library of templates into properties templates and constraint templates, the system design specification becomes much easier to express and understand.

From this example, it can be seen that in one illustrative embodiment of the invention can include a library having a finite set of property templates and a finite set of constraint templates. From such a library, a designer can define both properties and constraints of a system to define a system design specification. In addition, such a library can include property templates and constraint templates that have the same general structure or format (i.e. set of qualifiers and associated entry spaces) for defining system behavioral attributes. Using such similarly structured templates to define a system design specification, according to the present invention, will simplify the appearance of the templates to the designer, and may simplify the generation of computer code from the filled templates to test the system behavioral attributes through verification or simulation tools.

Moreover, in yet another embodiment of the invention, the designer may perform the function of selecting and filling the template through a means that does not utilize a query screen. Thus, it is understood herein that those skilled in the art can employ any desired means for selecting a template from the finite set of templates, and for filling the selected template with the appropriate system expressions.

In some embodiments, each template may have the same number of entry spaces, wherein each entry space is associated with a qualifier. To illustrate, each template may have three qualifiers: an enabling qualifier, a fulfilling qualifier and a discharging qualifier. Each such qualifier may be associated with a entry space of the template such that the qualifier qualifies the specific system expression entered into the entry space. A system expression entered into the entry space associated with a fulfilling qualifier can be said to represent a fulfilling condition of the system, wherein the fulfilling condition defines an event required by a system behavioral attribute. A system expression entered into the entry space associated with an enabling qualifier can be said to represent an enabling condition of the system, wherein the enabling condition defines a precondition for starting a check of the fulfilling condition. A system expression entered into the entry space associated with a discharging qualifier can be said to represent a discharging condition of the system, wherein the discharging condition signifies a condition after which said fulfilling condition is no longer required. Thus, to fill the entry spaces of a selected template, the designer need only be able to write the appropriate system expressions, wherein each system expression uses program variables of the system model to describe the appropriate condition or parameter. In one illustrative embodiment, some parameterized entry spaces may be left blank. Such an embodiment provides the designer with the ability to define a larger set of system properties and system constraints. To illustrate, if the third parameterized entry space, i.e. the discharging condition, of the template "AFTER( )ASSUMEALWAYS( )UNLESS( )" is left blank, the resulting template defines a different template, namely "AFTER( ) ASSUMEALWAYS( ).

It should be noted that the templates are not limited to a three-qualifier format, as described above. Rather, a template library according to the present invention may include templates that have no qualifiers, only a set of entry spaces. Or the templates may have having at least one qualifier and at least one associated entry space. For example, a library may include a template having the format "EVENTUALLY (fulfilling condition)." Or, a library may include a template with one qualifier having and associated entry space, and two optional qualifiers with associated entry spaces. For example, a template may have the format "Enabling Qualifier(enabling condition) Fulfilling Qualifier(fulfilling condition) Discharging Qualifier(discharging condition)," wherein only the fulfilling condition need be entered for the template to be "filled." A still further possibility is to provide a means for a designer to choose any one of several qualifiers, from a list of possible qualifiers, to form a desired template format. Any such template may be used, as described above, to define a design specification.

It should also be noted that the templates of a library composed of both a set of property templates and a set of constraint templates, can have a subset of property templates which have an enabling qualifier, wherein the enabling qualifier of a selected property template may be AFTER, or IF REPEATEDLY. In addition, each property template may have a fulfilling qualifier, wherein the fulfilling qualifier of a selected property template may be ALWAYS, NEVER, EVENTUALLY, or EVENTUALLY ALWAYS. Yet further, each property template may have a discharging qualifier, wherein the discharging qualifier of a selected template may be UNLESS, UNTIL, UNLESS AFTER, or UNTIL AFTER. In each selected property template, the qualifiers can be given their intuitive English language meaning, as described above.

It should further be noted that such a library, just described, may include a set of constraint templates, wherein each constraint template has an enabling qualifier, wherein the enabling qualifier of a selected constraint template may be AFTER, or IF REPEATEDLY. In addition, each constraint template may have a fulfilling qualifier, wherein the fulfilling qualifier of a selected constraint template may be ASSUME ALWAYS, ASSUME NEVER, ASSUME EVENTUALLY, or ASSUME EVENTUALLY ALWAYS. Yet further, each constraint template may have a discharging qualifier, wherein the discharging qualifier of a selected constraint template may be UNLESS, UNTIL, UNLESS AFTER, or UNTIL AFTER. In each selected constraint template, the qualifiers can be given their intuitive English language meaning, as described above.

In yet another illustrative embodiment, templates may have sequential elements that refer to a sequential clock of the system model. For example, in the template "AFTER (enabling condition)ByCLOCK(N)(fulfilling condition) UNLESS(discharging condition)," the qualifier ByCLOCK (N) may be used to qualify a parameterized entry space that in this example represent a fulfilling condition which is required to occur within N clock ticks of the time at which a specified enabling condition is satisfied.

An illustrative embodiment of a finite set of templates is shown and defined in Appendix A, attached hereto. Appendix A lists a substantially complete finite set of templates. That is, the set of templates listed in Appendix A substantially suffices to enable a designer to express all the intended behavioral attributes of a system that could be expressed through such templates. Or, stated differently, there is no template that can be added to the finite set of templates listed in Appendix A that could be used to express a system behavior not already expressible by the templates listed therein.

As shown, the first two pages of Appendix A list a complete set of templates, including a set of property templates shown on page 1 and a set of constraint templates shown on page 2. It may be observed that the only difference between the set of property templates and the set of constraint templates is that the constraint templates have qualifiers that include the tag "ASSUME", whereas the qualifiers of the property templates lack such a tag.

The third page of Appendix A shows a number of auxiliary variables and their associated subroutines which are useful for implementing the present invention. The remaining pages of Appendix A show invariant properties, eventuality properties and constraints, and their associated subroutines useful for implementing the present invention.

It should be noted that an apparatus embodying the present invention need not obtain the conditions, or system expressions, to fill the template from a manual entry by a designer. Such entries can be made by any means desired. For example, an apparatus according to the present invention can receive an input from other systems or machines, and/or obtain the information from a computer disk having the system expressions stored thereon. In addition, an apparatus according to the present invention, can present to a designer or a system, a set of query screens that provide the means for selecting the appropriate template and for entering the system expressions to fill the selected template, as described above.

Figure 3:
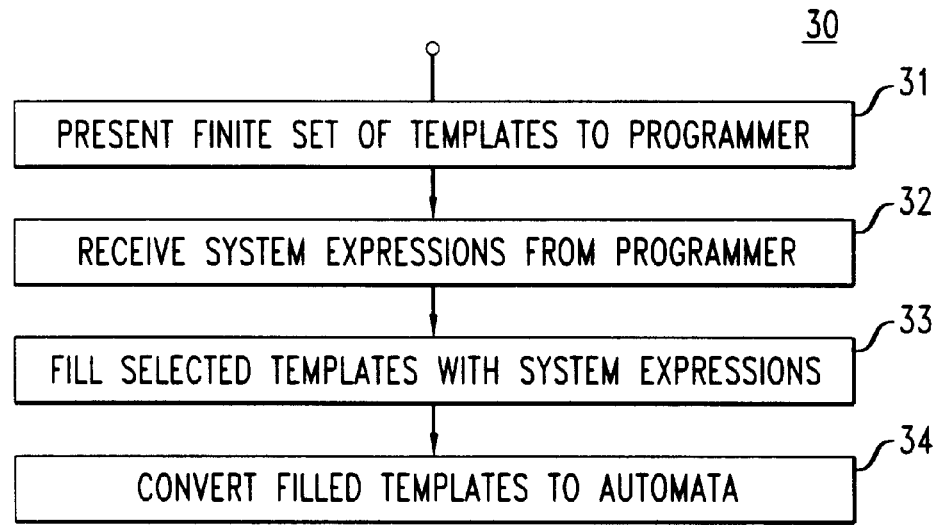
FIG. 3 is a block diagram of an illustrative embodiment of a method for defining a design specification of a system, according to the present invention.

Referring now to FIG. 3, there is shown a pictorial view of one illustrative embodiment of a method for defining a design specification of a system, according to the present invention, herein after referred to as method 30. As shown, method 30 includes at 31, the step of presenting the finite set of templates through query screens to enable the designer select templates, from a finite set of templates, that have the appropriate format for defining intended behavioral attributes of the system. Once a template is chosen for a given intended behavioral attribute, then at step 32 the required system expressions are received from the designer. The received system expressions are then input, at step 33, to fill the selected template, and thus form an expression of the intended behavioral attribute. This process is repeated for intended behavioral attributes being defined to form a system design specification. The system design specification can then be translated at step 34 into automata which can be used by a verification tool to test whether the system model behaves as intended (i.e. as defined in the system design specification). Such a translation can be performed by a set of subroutines.

One illustrative embodiment of such a set of subroutines is shown in Appendix A. In Appendix A, as previously noted, there is shown a set of templates, wherein each template has an associated subroutine for translating the template, when filled, into an automaton or a set of automata, which can serve to distinguish between acceptable behavior and unacceptable behavior of the system model.

The present invention, however, is not limited to the specific set of subroutines shown in Appendix A. A set of subroutines can be designed in any form desired by those skilled in the art to accomplish the method/apparatus/system of translating a set of filled templates, as described herein.

Figure 4:
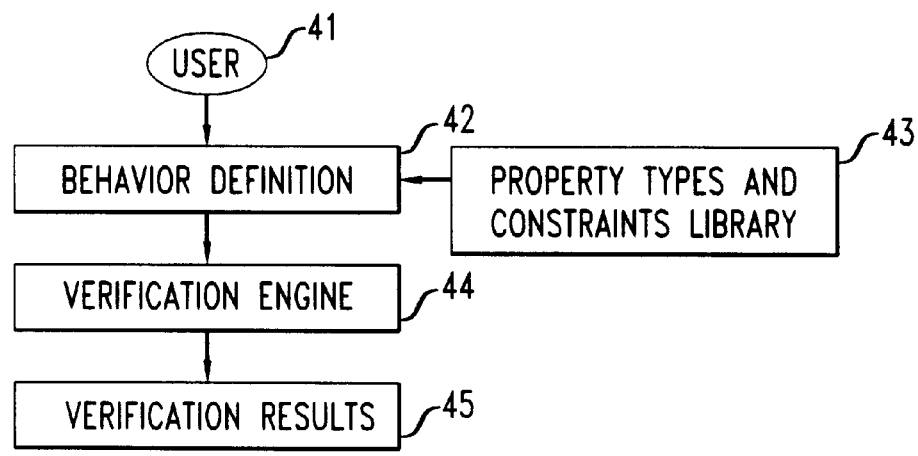
FIG. 4 is a block diagram view of an illustrative embodiment of a system for verifying the behavior of a model, according to the present invention.

A functional block diagram of a system for defining a system model design specification, translating the system model design specification to automata and checking the behavior of the system model with the automata, according to the present invention, is shown in FIG. 4. As shown, a designer 41 establishes a definition of the intended behaviors of the model at 42. A set of property templates and constraint template are chosen, at 43, from a library having a finite set of templates. The designer can then fill the selected template with system expressions written in terms of system model variables, to define a system design specification. The system design specification can then be used to generate a set of logical expressions (i.e. automata) which are fed, along with a definition of the model, to a verification engine at 44 to check whether the model behaves as defined in the design specification. The results of the verification are reported at 45.

While the invention has been particularly shown and described with reference to various embodiments, it will be recognized by those skilled in the art that modifications and changes may be made to the present invention without departing from the spirit and scope thereof. Therefore, the invention in its broader aspects is not limited to specific details shown and described herein. Accordingly, various modifications may be made without departing from the spirit or scope of the general inventive concept as defined by the appended claims and their equivalents.

DePalma-Glaser-Kurshar Wesley 1-5-14-1

APPENDIX A

QRY.h

/* FormalCheck Query Implementation Automata
    S/R Proctype Library Qry2.h: Multiple Properties, Return-To-Init-Check compatible All PROPERTIES and CONSTRAINTS are PHASE-RELATIVE TIME-INVARIANT(*) unless marked (+)

PROPERTIES
================================================================================

```
! P1[m]    Always/Never[m]___                                       (4 PROPERTIES)
! P2[m]    If___Always/Never[m]___Unless[After]___                  (8)
  P6[m]    If___Always/Never[m]___Until[After]___                   (8)
! p2[m]    If___Always/Never[m]___                                  (4)
! P3[m]    Always/Never[m]___Unless[After]___              (+)      (8)
  P7[m]    Always/Never[m]___Until[After]___               (+)      (8)

P4[m]    If___ByClock<N>[m]___Unless___ <clock-condition>          (2)
  P5[m]    If___OnlyByClock<N>[m]___Unless___ <clock-condition>      (2)

! P6a      If___Eventually___
! p6a      If___Eventually___Unless___
! c1          Eventually___                                 (+)
! c1          Eventually___Unless___                        (+)

! P8       If___EventuallyAlways___Unless___
! p8       If___EventuallyAlways___
! P10         EventuallyAlways___Unless___                  (+)
! P8a         EventuallyAlways___

P9       If___Repeatedly___Unless___
  p9       If___Repeatedly___
  P11         Repeatedly___Unless___                        (+)
  P12a        Repeatedly___ p12a     IfEventuallyAlways___Eventually___
  p12a     IfEventuallyAlways___Repeatedly___               (WL)
  p12      IfEventuallyAlways___EventuallyAlways___ p12      IfRepeatedly___Eventually___
! P12      IfRepeatedly___Repeatedly___                     (SL)
  P13      IfRepeatedly___EventuallyAlways___
```

(WL) Weak Liveness
(SL) Strong Liveness (!) supported in the FormalCheck GUI
(P,C) a primary property/constraint, represented as an automaton below
(p,c) a secondary property/constraint, expressed in terms of the primary ones
[m] a variation to show all variable values leading to state after failure,
    at some computational expense; designated 'mealy..' below
(*) PHASE-RELATIVE TIME-INVARIANT: true ALWAYS, at each instant of time having no pending fulfillment
    obligation (ie, true whenever PHASE=0 [p0], as defined below)
(+) checked ONLY ONCE relative to initial state alone (rather than TIME-INVARIANT)

−17−

QRY.h

```
        CONSTRAINTS
        ================================================================

! C1    AssumeAlways/Never___                                    (2 CONSTRAINTS)
! C2    If___AssumeAlways/Never___Unless[After]___               (4)
  C6    If___AssumeAlways/Never___Until[After]___                (4)
! c2    If___AssumeAlways/Never___                               (2)
! C3    AssumeAlways/Never___Unless[After]___        (+)         (4)
  C7    AssumeAlways/Never___Until[After]___         (+)         (4)

C4    If___AssumeByClock<N>___Unless___ <clock-condition>
  C5    If___AssumeOnlyByClock<N>___Unless___ <clock-condition>

! c6    If___AssumeEventually___
! c6    If___AssumeEventually___Unless___
! c7        AssumeEventually___                      (+)
! c7        AssumeEventually___Unless___             (+)

! C8    If___AssumeEventuallyAlways___Unless___      (SF+)
! c8    If___AssumeEventuallyAlways___
! C10       AssumeEventuallyAlways___Unless___       (+)
! p12a      AssumeEventuallyAlways___

C9    If___AssumeRepeatedly___Unless___            (SF+)
  c9    If___AssumeRepeatedly___
  C11       AssumeRepeatedly___Unless___             (+)
  p8a       AssumeRepeatedly___ p8a   IfEventuallyAlways___AssumeEventually___
  p8a   IfEventuallyAlways___AssumeRepeatedly___     (WF)
  c12   IfEventuallyAlways___AssumeEventuallyAlways___ c12   IfRepeatedly___AssumeEventually___
! C12   IfRepeatedly___AssumeRepeatedly___           (SF)
  C13   IfRepeatedly___AssumeEventuallyAlways___
```

(WF) Weak Fairness
(SF[+]) Strong Fairness [-based]

Each PROPERTY, defined by an L-automaton A, has the same language $L(A)$ as the L-process $P(A)$ defining the corresponding CONSTRAINT (formed by prefixing the PROPERTY fulfilling-condition directive by "Assume"):
$$L(A) = L(P(A)) ;$$
its DUAL A#, defined by considering A itself as an L-process, has the complementary language:
$$L(A\#) = L(P(A))'.$$
With the exception of the SF-based processes which are not strongly deterministic, the DUAL $P(A)\#$ of each (CONSTRAINT-defining) L-process $P(A)$ (defined by considering $P(A)$ as an L-automaton) defines the language complementary to that of A:
$$L(P(A)\#) = L(A)'.$$
[NB: constructs utilizing "lockup" and 'kill' have inferred states and cyset's which depend on whether it defines an L-automaton or an L-process.] For more information, refer to:
   R. Kurshan, Computer-Aided Verification of Coordinating Processes
   Princeton Univ. Press (1994), ISBN: 0-691-03436-2
*/

DePalma-Glaser-Kurshan-Wesley 1-5-14-1

QRY.h                                                        AUXILIARY VARIABLES

/* AUXILIARY VARIABLES */

```
proctype NAT( _limit, _initial, _input : integer )    /* NATURAL VARIABLE */         NAT()
    import  _input
    selvar  # := $
    stvar   $ : (0.._limit)          init    $ := _initial
    asgn    $ → _input
end NAT()

proctype INT( _limit, _initial, _input : integer )    /* INTEGER VARIABLE */         INT()
    import  _input
    selvar  # := $
    stvar   $ : (-_limit.._limit)    init    $ := _initial
    asgn    $ → _input
end INT()

proctype STR( _initial, _input : string )             /* STRING VARIABLE */          STR()
    import  _input
    selvar  # := $
    stvar   $ : string       /* 'string' is type of list of all strings declared in spec*/
    init    $ := _initial
    asgn    $ → _input
end STR()

proctype PHASE( _set, _clear : boolean )              /* 2-PHASE BOOLEAN LATCH */    PHASE()
    import  _set, _clear
    stvar   $ : boolean              init    $:=0
    asgn    $ → 1 ? _set*-$ | 0 ? _clear | $     /* p0 is PHASE=0 ($=0) */
end PHASE()

proctype DirectSum( _N : integer )                    /* DIRECT SUM */               DirectSum()
    /* Forms the direct sum of automata, to support checking several PROPERTIES together (equivalent to
    several checks comprising one PROPERTY per check [each "check" involving a separate run of cospan]).
    There may be a significant time and space penalty in checking a direct sum (and there may not be).
    To form the direct sum of N PROPERTIES, declare DirectSum(N) as
                    proc s: DirectSum(N)
    (say) and condition the automaton acceptance condition of the i-th PROPERTY on (.s:i). */
    selvar  # := $
    stvar   $ : (0.._N-1)            init    $ := {0.._N-1}
    asgn    $ → $
end DirectSum()

proctype NoDet( _hi_sig : integer )                   /* Non-deterministic choice */ NoDet()
    selvar  # : (0.._hi_sig)
    asgn    # := {0.._hi_sig}
end NoDet()
```

-19-

DePalma-Glaser-Kurshan-Wesley 1-5-14-1

QRY.h                                                                                      INvARIANT PROPERTIES

/*      *For greater efficiency in run time and memory usage in the verification of INVARIANT PROPERTIES, the*
        *L-automaton acceptance structure expressed in terms of 'cyset' and 'recur' declarations is replaced*
        *by an operational check which forces a lockup (run-time syntax error) for violations of the invariant.*
        *With this implementation (and unlike L-automata), INVARIANT PROPERTIES are conjunctive, so any*
        *number of these properties may be checked together, in a single verification run, either with*
        *'cospan -u ..' or together with an EVENTUALITY PROPERTY (which may be simply DFS() or BFS()).*
*/

/* GENERAL STATE INVARIANTS */

```
/*P1*/ proctype Always_( _fulfilled : boolean ) /* Invariantly _fulfilled, for Moore processes;          Always_()
            with Mealy processes ('cospan -m ..'), Always_() = AssumeAlways_()# */
            /*      LTL: Gf
            Never_(f) = Always_(~f)
            */
       import _fulfilled
       stvar  $ : (1)
       init   1
       trans  true    →1 : _fulfilled    /* lockup if ~_fulfilled */
       end Always_()

/*P1m*/ proctype mealyAlways_( _fulfilled : boolean ) /* Always_(), for Mealy processes */   mealyAlways_()
            /*
            mealyNever_(f) = mealyAlways_(~f)
            */
       import _fulfilled
       stvar  $ : boolean
       init   1
       trans  $=1    → _fulfilled : true        /* lockup after ~_fulfilled */
       end mealyAlways_()
```

DePalma-Glaser-Kurshan-Wesley 1-5-14-1

QRY.h                                                          INVARIANT PROPERTIES

/* PHASE-RELATIVE STATE INVARIANTS */

```
/*P2*/ proctype If_Always_Unless_( _enabled, _fulfilled, _discharged : boolean )    If_Always_Unless_()
       /*      LTL: G(e*p0 -> X(Gf + fUd))
               If_Never_Unless_(e,f,d) = If_Always_Unless_(e,-f,d)
               If_Always_UnlessAfter_(e,f,d) = If_Always_Unless_(e,f,f*d)
                   LTL: G(e*p0 -> X(Gf + fU(f*d)))
               If_Never_UnlessAfter_(e,f,d) = If_Always_Unless_(e,-f,-f*d)
               If_Always_(e,f) = If_Always_Unless_(e,f,false)
               If_Never_(e,f) = If_Always_Unless_(e,-f,false)
       */
       import _enabled, _fulfilled, _discharged
       monitor ENABLED: PHASE( _enabled, _discharged )                                ENABLED
       monitor S: Always_( _fulfilled + _discharged + ~ENABLED.$ )                    S
       end If_Always_Unless_()

/*P2m*/ proctype If_mealyAlways_Unless_(                                   If_mealyAlways_Unless_()
                              _enabled, _fulfilled, _discharged : boolean )
       /* If_mealyNever_Unless_(e,f,d) = If_mealyAlways_Unless_(e,-f,d)
          If_mealyAlways_UnlessAfter_(e,f,d) = If_mealyAlways_Unless_(e,f,f*d)
          If_mealyNever_UnlessAfter_(e,f,d) = If_mealyAlways_Unless_(e,-f,-f*d)
          If_mealyAlways_(e,f) = If_mealyAlways_Unless_(e,f,false)
          If_mealyNever_(e,f) = If_mealyAlways_Unless_(e,-f,false)
       */
       import _enabled, _fulfilled, _discharged
       monitor ENABLED: PHASE( _enabled, _discharged )                                ENABLED
       monitor S: mealyAlways_( _fulfilled + _discharged + ~ENABLED.$ )               S
       end If_mealyAlways_Unless_()

/*P3*/ proctype Always_Unless_( _fulfilled, _discharged : boolean )                   Always_Unless_()
       /*      LTL: Gf + fUd    [WEAK UNTIL]
               Never_Unless_(f,d) = Always_Unless_(-f,d)
               Always_UnlessAfter_(f,d) = Always_Unless_(f,f*d)
                   LTL: Gf + fU(f*d)
               Never_UnlessAfter_(f,d) = Always_Unless_(-f,-f*d)
       */
       import _fulfilled, _discharged
       monitor DISCHARGED: PHASE( _discharged, false )                                DISCHARGED
       monitor S: Always_( _fulfilled + _discharged + DISCHARGED.$ )                  S
       end Always_Unless_()

/*P3m*/ proctype mealyAlways_Unless_( _fulfilled, _discharged : boolean )    mealyAlways_Unless_()
       /*      [WEAK UNTIL for Mealy processes]
               mealyNever_Unless_(f,d) = mealyAlways_Unless_(-f,d)
               mealyAlways_UnlessAfter_(f,d) = mealyAlways_Unless_(f,f*d)
               mealyNever_UnlessAfter_(f,d) = mealyAlways_Unless_(-f,-f*d)
       */
       import _fulfilled, _discharged
       monitor DISCHARGED: PHASE( _discharged, false )                                DISCHARGED
       monitor S: mealyAlways_( _fulfilled + _discharged + DISCHARGED.$ )             S
       end mealyAlways_Unless_()
```

DePalma-Glaser-Kurshan-Wesley 1-5-14-1

QRY.h                                                    INVARIANT PROPERTIES

```
/* CLOCK-RELATIVE STATE INVARIANTS
   Invariants relative to given clock and PHASE
*/

/*P4*/ proctype If_ByClock_Unless_(                              If_ByClock_Unless_()
                     _enabled, _fulfilled, _discharged, _clock : boolean;  _N : integer )
       /* If _enabled then By _clock _N _fulfilled, Unless _discharged
              LTL: for h(z) = X(f+d+z), G(e*p0 -> h^N(0))  [N-fold composition]
       */
       import  _enabled, _fulfilled, _discharged, _clock
       stvar   $ : (0.._N)
       init    0
       macro   PassTest := _fulfilled + _discharged
       trans   0        →1      : _enabled*(_N>0)
                        →0      : -_enabled + (_N=0)*PassTest;  /* else lockup */

$>0      →0      : PassTest
                        →$+1    : else*_clock*($<_N)
                        →$      : else*($<_N)    /* lockup on _clock if $=_N */
       end If_ByClock_Unless_()

/*P4m*/ proctype mealyIf_ByClock_Unless_(                      mealyIf_ByClock_Unless_()
                     _enabled, _fulfilled, _discharged, _clock : boolean;  _N : integer )
       import  _enabled, _fulfilled, _discharged, _clock
       stvar   $ : (0.._N+1)
       init    0
       macro   PassTest := _fulfilled + _discharged
       trans   0        →1      : _enabled*(_N>0)
                        →0      : -_enabled + (_N=0)*PassTest
                        →_N+1   : else;  /* lockup at next step */

$<_N+1   →0      : PassTest
                        →$+1    : else*_clock       /* lockup after _clock if $=_N */
                        →$      : else
       end mealyIf_ByClock_Unless_()
```

DePalma-Glaser-Kurshan-Wesley 1-5-14-1

QRY.h                                                            INVARIANT PROPERTIES

```
/*P5*/ proctype If_OnlyByClock_Unless_(                        If_OnlyByClock_Unless_()
                      _enabled, _fulfilled, _discharged, _clock : boolean; _N : integer )
       /* If _enabled then OnlyBy _clock _N _fulfilled, Unless _discharged
              LTL: for h(z) = X(d+z), G(e*p0 -> (X^N)f + h^N(0))
       */
       import _enabled, _fulfilled, _discharged, _clock
       stvar  $ : (0.._N)
       init   0
       macro  PassTest := _fulfilled*(_N=$) + _discharged
       trans  0      ->1    : _enabled*(_N>0)
                     ->0    : ~_enabled + (_N=0)*PassTest;     /* else lockup */

$>0    ->0    : PassTest
                     ->$+1  : ~_fulfilled*~_discharged*_clock*($<_N) /* lockup on _clock if $=_N */
                     ->$    : ~_fulfilled*~_discharged*~_clock       /* lockup on _fulfilled if $<_N */
       end If_OnlyByClock_Unless_()

/*P5m*/ proctype mealyIf_OnlyByClock_Unless_(                  mealyIf_OnlyByClock_Unless_()
                      _enabled, _fulfilled, _discharged, _clock : boolean; _N : integer )
       import _enabled, _fulfilled, _discharged, _clock
       stvar  $ : (0.._N+1)
       init   0
       macro  PassTest := _fulfilled*(_N=$) + _discharged
       trans  0      ->1    : _enabled*(_N>0)
                     ->0    : ~_enabled + (_N=0)*PassTest
                     ->_N+1 : else; /* lockup at next step */

$<_N+1 ->0    : PassTest
                     ->_N+1 : _fulfilled*($<_N)
                     ->$+1  : ~_fulfilled*~_discharged*_clock /* lockup after _clock if $=_N */
                     ->$    : else
       end mealyIf_OnlyByClock_Unless_()

/* ACCEPT ALL EVENTUALITIES
   'true' for eventualities; one of the following must be added to a set of PROPERTIES which consists
   of INVARIANT PROPERTIES alone (no EVENTUALITY PROPERTIES)
*/ proctype BFS() recur true end BFS() /*BREADTH-FIRST SEARCH forces complete bfs reachability*/    BFS()

proctype DFS() cyset true end DFS() /*DEPTH-FIRST SEARCH forces complete dfs reachability*/      DFS()

#ifndef RETURNTOINIT
#define RETURNTOINIT 0
#else
#define RETURNTOINIT 1
endif if DIRECTSUMof > 0
proc s : DirectSum( DIRECTSUMof )                                                                  s
#endif
```

DePalma-Glaser-Kurshan-Wesley 1-5-14-1

QRY.h                                                       EVENTUALITY PROPERTIES

```
/*
    Since L-automata are disjunctive (the language of the product is the union of the languages), all
    properties defined below either must be run with no other PROPERTIES, except in conjunction with
    INVARIANT PROPERTIES as explained above, or else must be run as an explicit DIRECT SUM,
    utilizing DirectSum() defined above.
*/

/* INVARIANT/EVENTUALITY HYBRIDS
    Constructs incorporating STRONG UNTIL
*/

/*P6*/ proctype If_Always_Until_( _i : integer; _enabled, _fulfilled, _discharged : boolean    If_Always_Until_()
                /*     LTL: G(e*p0 -> X(fUd))   [PHASE-relative STRONG UNTIL]
                       = If_Always_Unless_(e,f,d) ∧ If_Eventually_(e,d)
                    If_Never_Until_(e,f,d) = If_Always_Until_(e,-f,d)
                    If_Always_UntilAfter_(e,f,d) = If_Always_Until_(e,f,f*d)
                        LTL: G(e*p0 -> X(fUf*d))
                    If_Never_UntilAfter_(e,f,d) = If_Always_Until_(e,-f,-f*d)
                    If_Eventually_(e,f) = If_Always_Until_(e,true,f)
                        LTL: G(e*p0 -> XFf)
                */
        import  .s, _enabled, _fulfilled, _discharged
        recur   -G.ENABLED.$*(.s:_i)
        monitor G: If_Always_Unless_( _enabled*(.s:_i), _fulfilled, _discharged )              G
        end If_Always_Until_()

/*P6m*/ proctype If_mealyAlways_Until_(                                       If_mealyAlways_Until_()
                        _i : integer; _enabled, _fulfilled, _discharged : boolean )
                /*
                    If_mealyNever_Until_(e,f,d) = If_mealyAlways_Until_(e,-f,d)
                    If_mealyAlways_UntilAfter_(e,f,d) = If_mealyAlways_Until_(e,f,f*d)
                    If_mealyNever_UntilAfter_(e,f,d) = If_mealyAlways_Until_(e,-f,-f*d)
                */
        import  .s, _enabled, _fulfilled, _discharged
        recur   -G.ENABLED.$*(.s:_i)
        monitor G: If_mealyAlways_Unless_( _enabled*(.s:_i), _fulfilled, _discharged )         G
        end If_mealyAlways_Until_()
```

DePalma-Glaser-Kurshan-Wesley 1-5-14-1

QRY.h                                              EVENTUALITY PROPERTIES

```
/*P7*/ proctype Always_Until_( _i : integer; _fulfilled, _discharged : boolean )        Always_Until_()
          /*       LTL: fUd        [STRONG UNTIL]
                 = Always_(f) ∧ AssumeNever_(d)#, checked as an EVENTUALITY
          Never_Until_(f,d) = Always_Until_(~f,d)
          Always_UntilAfter_(f,d) = Always_Until_(f,f*d)
                 LTL: fU(f*d)
          Never_UntilAfter_(f,d) = Always_Until_(~f,~f*d)
          */
   import  .s, _fulfilled, _discharged
   kill    _discharged*(.s:_i)
   monitor G: Always_( _fulfilled + ~(.s:_i) )                                            G
   end Always_Until_()

/*P7m*/ proctype mealyAlways_Until_( _i : integer; _fulfilled, _discharged : boolean ) mealyAlways_Until_()
          /*
                 = mealyAlways_(f) ∧ AssumeNever_(d)#, checked as an EVENTUALITY
          mealyNever_Until_(f,d) = mealyAlways_Until_(~f,d)
          mealyAlways_UntilAfter_(f,d) = mealyAlways_Until_(f,f*d)
          mealyNever_UntilAfter_(f,d) = mealyAlways_Until_(~f,~f*d)
          */
   import  .s, _fulfilled, _discharged
   kill    _discharged*(.s:_i)
   monitor G: mealyAlways_( _fulfilled + ~(.s:_i) )                                       G
   end mealyAlways_Until_()
```

QRY.h                                            EVENTUALITY PROPERTIES

```
/* INVARIANT-FREE EVENTUALITY PROPERTIES (L-automata)
    For each L-automaton A below, its DUAL A# is A considered as an L-process. If P(A) defines the
    CONSTRAINT corresponding to A (identified by adding the modifier "Assume" in its name), then
    the language of each dual A# is the complement of the language of P(A):
                    L(A#) = L(P(A))' .
*/

/*P8a*/ proctype EventuallyAlways_( _i : integer; _fulfilled : boolean )          EventuallyAlways_()
            /*      LTL: GFG(f)
                AssumeRepeatedly_(f) = EventuallyAlways_(-f)#
                IfEventuallyAlways_AssumeEventually_(e,f) = EventuallyAlways_(e*-f)#
                IfEventuallyAlways_AssumeRepeatedly_(e,f) = EventuallyAlways_(e*-f)#
            */
        import .s. _fulfilled
        stvar  S : boolean      init S := {0..RETURNTOINIT}    cyset S=1
        asgn   S → _fulfilled*(.s:_i)
        end EventuallyAlways_()

/*P12a*/ proctype Repeatedly_( _i : integer; _fulfilled: boolean )                Repeatedly_()
            /*      LTL: GFf
                    = IfRepeatedly_Repeatedly_(true,f)
                IfEventuallyAlways_Eventually_(e,f) = Repeatedly_(-e+f)
                    LTL: G(FGe -> GFf)    [WEAK LIVENESS]
                IfEventuallyAlways_Repeatedly_(e,f) = Repeatedly_(-e+f)
                    LTL: G(FGe -> GFf)
                AssumeEventuallyAlways_(f) = Repeatedly_(-f)#
            */
        import s. _fulfilled     recur _fulfilled*(.s:_i)
        end Repeatedly_()

/*P12*/ proctype IfRepeatedly_Repeatedly_( _i : integer; _enabled, _fulfilled : boolean )  IfRepeatedly_Repeatedly_()
            /*      LTL: G(GFe -> GFf)    [STRONG LIVENESS]
                IfRepeatedly_Eventually_(e,f) = IfRepeatedly_Repeatedly_(e,f)
                    LTL: G(GFe -> Ff)
                IfEventuallyAlways_EventuallyAlways_(e,f) = IfRepeatedly_Repeatedly_(-f,-e)
                    LTL: G(FGe -> FGf)
            */
        import .s. _enabled, _fulfilled
        recur   _fulfilled*(.s:_i)                /*Recurringly _fulfilled, or ..*/
        monitor FG: EventuallyAlways_(_i, -_enabled)    /*finally not _enabled*/      FG
        end IfRepeatedly_Repeatedly_()

/*P6a*/ proctype If_Eventually_( _i : integer; _enabled, _discharged : boolean )   If_Eventually_()
            /*      LTL: G(e*p0 ->XFd)
                If_Eventually_Unless_(e,f,d) = If_Eventually_(e,f+d)
                    LTL: G(e*p0 -> XF(f+d))
            */
        import .s. _enabled, _discharged
        recur   -ENABLED.$*(.s:_i)
        monitor ENABLED: PHASE( _enabled*(.s:_i), _discharged )                       ENABLED
        end If_Eventually_()
```

DePalma-Glaser-Kurshan-Wesley 1-5-14-1

QRY.h                                              EVENTUALITY PROPERTIES

```
/*P8*/ proctype If_EventuallyAlways_Unless_(                 If_EventuallyAlways_Unless_()
                       _i : integer; _enabled, _fulfilled, _discharged : boolean )
       /*     LTL: G(e*p0 -> X(FGf + Fd))
              If_EventuallyAlways_(e,f) = If_EventuallyAlways_Unless_(e,f,false)
                    LTL: G(e*p0 -> FGf)
       */
       import .s, _enabled, _fulfilled, _discharged
       monitor ENABLED: PHASE( _enabled*(.s:_i), _discharged )                ENABLED
       monitor SL: IfRepeatedly_Repeatedly_(_i, ENABLED.$*-_fulfilled, _discharged)    SL
       end If_EventuallyAlways_Unless_()

/*P9*/ proctype If_Repeatedly_Unless_( _i : integer; _enabled, _fulfilled, _discharged If_Repeatedly_Unless_()
       /*     LTL: G(e*p0 -> X(GFf + Fd))
              If_Repeatedly_(e,f) = If_Repeatedly_Unless_(e,f,false)
                    LTL: G(e -> GFf)
       */
       import .s, _enabled, _fulfilled, _discharged
       monitor ENABLED: PHASE( _enabled*(.s:_i), _discharged )                ENABLED
       monitor SL: IfRepeatedly_Repeatedly_(_i, ENABLED.$, _fulfilled + _discharged)   SL
       end If_Repeatedly_Unless_()

/*P10*/ proctype EventuallyAlways_Unless_( _i : integer; _fulfilled, _discharged EventuallyAlways_Unless_()
       /*     LTL: F(Gf + d) */
       import .s, _fulfilled, _discharged
       monitor DISCHARGED: PHASE( _discharged*(.s:_i), false )                DISCHARGED
       monitor FG: EventuallyAlways_(_i, _fulfilled + DISCHARGED.$)           FG
       end EventuallyAlways_Unless_()

/*P11*/ proctype Repeatedly_Unless_( _i : integer; _fulfilled, _discharged : boolean )  Repeatedly_Unless_()
       /*     LTL: GFf + Fd */
       import .s, _fulfilled, _discharged
       recur  (_fulfilled + DISCHARGED.$)*(.s:_i)
       monitor DISCHARGED: PHASE( _discharged*(.s:_i), false )                DISCHARGED
       end Repeatedly_Unless_()

/*P13*/ proctype IfRepeatedly_EventuallyAlways_(              IfRepeatedly_EventuallyAlways_()
                       _i : integer; _enabled, _fulfilled : boolean )
       /*     LTL: G(GFe -> FGf)
              = EventuallyAlways_(-e)VEventuallyAlways_(f)
       */
       import .s, _enabled, _fulfilled
       monitor FG[i<2]: EventuallyAlways_(_i, -_enabled?i=0 | _fulfilled)     FG
       end IfRepeatedly_EventuallyAlways_()
```

DePalma-Glaser-Kurshan-Wesley 1-5-14-1

QRY.h                                                            CONSTRAINTS

/* GENERAL STATE INVARIANTS

*For greater efficiency in run time and memory usage in the verification of INVARIANT CONSTRAINTS, the L-process acceptance structure expressed in terms of 'cyset' and 'recur' declarations is replaced to the extent possible by an operational check expressed through the use of a 'kill' declaration. This excepts violations of a constraint invariant by TRUNCATING the state space search at each state in which a violation occurs. This does not alter the conjunctive semantics (the "language intersection property"), of L-processes, so any number of CONSTRAINTS of any type may be combined in the formation of a query.*

*/

```
/*C1*/ proctype AssumeNever_( _fulfilled : boolean )                        AssumeNever_()
              /*      = If_AssumeEventually_(f,false)
              AssumeAlways_(f) = AssumeNever_(-f)
              Eventually_(f) = AssumeNever_(f) checked as an EVENTUALITY
                     LTL: Ff
              Eventually_Unless_(f,d) = AssumeNever_(f+d) checked as an EVENTUALITY
                     LTL: Ff + Fd
              */
       import _fulfilled
       kill   _fulfilled      /*truncates upon '_fulfilled'*/
       end AssumeNever_()

/*C2*/ proctype If_AssumeAlways_Unless_(                              If_AssumeAlways_Unless_()
                            _enabled, _fulfilled, _discharged : boolean )
              /*
              If_AssumeNever_Unless_(e,f,d) = If_AssumeAlways_Unless_(e,-f,d)
              If_AssumeAlways_UnlessAfter_(e,f,d) = If_AssumeAlways_Unless_(e,f,f*d)
              If_AssumeNever_UnlessAfter_(e,f,d) = If_AssumeAlways_Unless_(e,-f,-f*d)
              If_AssumeAlways_(e,f) = If_AssumeAlways_Unless_(e,f,false)
              If_AssumeNever_(e,f) = If_AssumeAlways_Unless_(e,-f,false)
              */
       import _enabled, _fulfilled, _discharged
       kill    ENABLED.$*-_discharged*-_fulfilled
       monitor ENABLED: PHASE( _enabled, _discharged )                      ENABLED
       end If_AssumeAlways_Unless_()

/*C3*/ proctype AssumeAlways_Unless_( _fulfilled, _discharged : boolean )   AssumeAlways_Unless_()
              /*
              AssumeNever_Unless_(f,d) = AssumeAlways_Unless_(-f,d)
              AssumeAlways_UnlessAfter_(f,d) = AssumeAlways_Unless_(f,f*d)
              AssumeNever_UnlessAfter_(f,d) = AssumeAlways_Unless_(-f,-f*d)
              */
       import _fulfilled, _discharged
       kill    -DISCHARGED.$*-_discharged*-_fulfilled
       monitor DISCHARGED: PHASE( _discharged, false )                      DISCHARGED
       end AssumeAlways_Unless_()
```

DePalma-Glaser-Kurshan-Wesley 1-5-14-1

QRY.h                                                                   CONSTRAINTS

/* CLOCK-RELATIVE STATE INVARIANTS
   Invariants relative to given clock and PHASE
*/

/*C4*/ proctype If_AssumeByClock_Unless_(                    *If_AssumeByClock_Unless_()*
                        _enabled, _fulfilled, _discharged, _clock : boolean; _N : integer )
       /* If _enabled then Assume By _clock _N _fulfilled, Unless _discharged */
       import _enabled, _fulfilled, _discharged, _clock
       stvar  $ : (0.._N)
       init   0
       macro  PassTest := _fulfilled + _discharged
       kill   ((_N=0)*_enabled + ($=_N)*_clock)*~PassTest
       trans  0    →1      : _enabled*(_N>0)
                        →0      : else;

$>0   →0      : PassTest
                        →$+1    : else*_clock
                        →$      : else
       end If_AssumeByClock_Unless_()

/*C5*/ proctype If_AssumeOnlyByClock_Unless_(                *If_AssumeOnlyByClock_Unless_()*
                        _enabled, _fulfilled, _discharged, _clock : boolean; _N : integer )
       /* If _enabled then Assume OnlyBy _clock _N _fulfilled, Unless _discharged */
       import _enabled, _fulfilled, _discharged, _clock
       stvar  $ : (0.._N)
       init   0
       macro  PassTest := _fulfilled*(_N=$) + _discharged
       kill   (_N=0)*_enabled*~_fulfilled*~_discharged
       kill   _fulfilled*($<_N) + ($=_N)*_clock*~_fulfilled*~_discharged
       trans  0    →1      : _enabled*(_N>0)
                        →0      : else;

$>0   →0      : PassTest
                        →$+1    : else*_clock
                        →$      : else
       end If_AssumeOnlyByClock_Unless_()

DePalma-Glaser-Kurshan-Wesley 1-5-14-1

QRY.h                                                    CONSTRAINTS

/* EVENTUALITY CONSTRAINTS

*For each L-process P below, its DUAL P# is P considered as an L-automaton. If P = P(A) is the CONSTRAINT which corresponds to the PROPERTY A (A identified by removing the "Assume" from the name of P), then with the exception of the SF-based processes which are not strongly deterministic, the language of each dual P# is the complement of the language of the PROPERTY A:*
$$L(P\#) = L(A)'.$$
*/

```
/*C12*/ proctype IfRepeatedly_AssumeRepeatedly_(                IfRepeatedly_AssumeRepeatedly_()
                         _enabled, _fulfilled : boolean )
              /*      LTL: G(GFe -> GFf)      [STRONG FAIRNESS]
                 IfRepeatedly_AssumeEventually_(e,f) = IfRepeatedly_AssumeRepeatedly_(e,f)
                 IfEventuallyAlways_AssumeEventuallyAlways_(e,f) = IfRepeatedly_AssumeRepeatedly_(-f,-e)
              */
       import _enabled, _fulfilled
       macro  DS:= IfRepeatedly_AssumeRepeatedly_.s
       recur  _enabled*(DS:0)                       /* eventually always not _enabled */
       stvar  S : boolean      init S := {0..RETURNTOINIT}    cyset S=1
       asgn   S -> ~ _fulfilled*(DS:1)
       proc   s: DirectSum(2)                       /* or */                           s
       /*monitor    FG: EventuallyAlways_(~ fulfilled*(DS:1)) /* repeatedly fulfilled */
       end IfRepeatedly_AssumeRepeatedly_()

/*C6*/ proctype If_AssumeAlways_Until_(                         If_AssumeAlways_Until_()
                         _enabled, _fulfilled, _discharged : boolean )
              /*
                 If_AssumeNever_Until_(e,f,d) = If_AssumeAlways_Until_(e,-f,d)
                 If_AssumeAlways_UntilAfter_(e,f,d) = If_AssumeAlways_Until_(e,f,f*d)
                 If_AssumeNever_UntilAfter_(e,f,d) = If_AssumeAlways_Until_(e,-f,-f*d)
                 If_AssumeEventually_(e,f) = If_AssumeAlways_Until_(e,true,f)
                 If_AssumeEventually_Unless_(e,f,d) = If_AssumeAlways_Until_(e,true,f+d)
              */
       import _enabled, _fulfilled, _discharged
       cyset  {G.ENABLED.$:=1}
       monitor G: If_AssumeAlways_Unless_( _enabled, _fulfilled, _discharged )          G
       end If_AssumeAlways_Until_()

/*C7*/ proctype AssumeAlways_Until_( _fulfilled, _discharged : boolean )    AssumeAlways_Until_()
              /*
                 AssumeNever_Until_(f,d) = AssumeAlways_Until_(-f,d)
                 AssumeAlways_UntilAfter_(f,d) = AssumeAlways_Until_(f,f*d)
                 AssumeNever_UntilAfter_(f,d) = AssumeAlways_Until_(-f,-f*d)
                 AssumeEventually_(f) = AssumeAlways_Until_(true,f)
                 AssumeEventually_Unless_(f,d) = AssumeAlways_Until_(true,f+d)
              */
       import _fulfilled, _discharged
       cyset  {G.DISCHARGED.$:=0}
       monitor G: AssumeAlways_Unless_( _fulfilled, _discharged )                       G
       end AssumeAlways_Until_()
```

DePalma-Glaser-Kurshan-Wesley 1-5-14-1

QRY.h                                                              CONSTRAINTS

```
/*C8*/ proctype If_AssumeEventuallyAlways_Unless_(        If_AssumeEventuallyAlways_Unless_()
                                    _enabled, _fulfilled, _discharged : boolean )
              /*
              If_AssumeEventuallyAlways_(e,f) = If_AssumeEventuallyAlways_Unless_(e,f,false)
              */
       import _enabled, _fulfilled, _discharged
       monitor ENABLED: PHASE( _enabled, _discharged )                      ENABLED
       monitor SF: IfRepeatedly_AssumeRepeatedly_(ENABLED.$*-_fulfilled, _discharged)   SF
       end If_AssumeEventuallyAlways_Unless_()

/*C9*/ proctype If_AssumeRepeatedly_Unless_(              If_AssumeRepeatedly_Unless_()
                                    _enabled, _fulfilled, _discharged : boolean )
              /*
              If_AssumeRepeatedly_(e,f) = If_AssumeRepeatedly_Unless_(e,f,false)
              */
       import _enabled, _fulfilled, _discharged
       monitor ENABLED: PHASE( _enabled, _discharged )                      ENABLED
       monitor SF: IfRepeatedly_AssumeRepeatedly_(ENABLED.$, _fulfilled + _discharged)  SF
       end If_AssumeRepeatedly_Unless_()

/*C10*/ proctype AssumeEventuallyAlways_Unless_(          AssumeEventuallyAlways_Unless_()
                                    _fulfilled, _discharged : boolean )
       import _fulfilled, _discharged
       recur   - _fulfilled*-DISCHARGED.$
       monitor DISCHARGED: PHASE( _discharged, false )           .        DISCHARGED
       end AssumeEventuallyAlways_Unless_()

/*C11*/ proctype AssumeRepeatedly_Unless_(                AssumeRepeatedly_Unless_()
                                    _fulfilled, _discharged : boolean )
       import _fulfilled, _discharged
       stvar   S : boolean    init S := {0..RETURNTOINIT}   cyset S=1
       asgn    S → - _fulfilled*-DISCHARGED.$
       /*monitor       FG: EventuallyAlways_( - _fulfilled*-DISCHARGED.$ )*/
       monitor DISCHARGED: PHASE( _discharged, false )                    DISCHARGED
       end AssumeRepeatedly_Unless_()

/*C13*/ proctype IfRepeatedly_AssumeEventuallyAlways_(   IfRepeatedly_AssumeEventuallyAlways_()
                                    _enabled, _fulfilled : boolean )
       import _enabled, _fulfilled
       recur   GF.$*-GF.$'    /* repeatedly _enabled and repeatedly - _fulfilled */
       monitor GF: PHASE( _enabled, - _fulfilled )                          GF
       end IfRepeatedly_AssumeEventuallyAlways_()

/* FormalCheck Query Implementation Automata (APPENDIX)
       S/R Proctype Library Qry2+.h: Multiple Properties, Return-To-Init-Check compatible
              15 March 1996
*/

/* GENERAL STATE INVARIANTS */
```

–31–

DePalma-Glaser-Kurshan-Wesley  5-14-1

QRY.h                                                                CONSTRAINTS

```
/*P1.1*/ proctype Never_( _fulfilled : boolean )                          Never_()
         /*      LTL: G-f */
         import  _fulfilled
         stvar   S : (1)
         init    1
         trans   true    → 1 : ~_fulfilled
         end Never_()

/*P1m.1*/ proctype mealyNever_( _fulfilled : boolean )                    mealyNever_()
          import  _fulfilled
          stvar   S : boolean
          init    1
          trans   S=1    →~_fulfilled : true
          end mealyNever_()

/* PHASE-RELATIVE STATE INVARIANTS */

/*P2.1*/ proctype If_Never_Unless_( _enabled, _fulfilled, _discharged : boolean )   If_Never_Unless_()
         /*      LTL: G(e*p0 -> X(G~f + ~fUd)) */
         import  _enabled, _fulfilled, _discharged
         monitor ENABLED: PHASE( _enabled, _discharged )                  ENABLED
         monitor S: Always_( ~_fulfilled + _discharged + ~ENABLED.S )     S
         end If_Never_Unless_()

/*P2m.1*/ proctype If_mealyNever_Unless_(                                 If_mealyNever_Unless_()
                   _enabled, _fulfilled, _discharged : boolean )
          import  _enabled, _fulfilled, _discharged
          monitor ENABLED: PHASE( _enabled, _discharged )                 ENABLED
          monitor S: mealyAlways_( ~_fulfilled + _discharged + ~ENABLED.S ) S
          end If_mealyNever_Unless_()

/*P2.2*/ proctype If_Always_UnlessAfter_(                                 If_Always_UnlessAfter_()
                   _enabled, _fulfilled, _discharged : boolean )
         /*      LTL: G(e*p0 -> X(Gf + fU(f*d))) */
         import  _enabled, _fulfilled, _discharged
         monitor ENABLED: PHASE( _enabled, _fulfilled*_discharged )       ENABLED
         monitor S: Always_( _fulfilled + ~ENABLED.S )                    S
         end If_Always_UnlessAfter_()
```

DePalma-Glaser-Kurshan-Wesley 5-14-1

QRY.h                                                                            CONSTRAINTS

```
/*P2m.2*/ proctype If_mealyAlways_UnlessAfter_(                        If_mealyAlways_UnlessAfter_()
                          _enabled, _fulfilled, _discharged : boolean )
          import _enabled, _fulfilled, _discharged
          monitor ENABLED: PHASE( _enabled, _fulfilled* _discharged )              ENABLED
          monitor S: mealyAlways_( _fulfilled + ~ENABLED.$ )                             S
          end If_mealyAlways_UnlessAfter_()

/*P2.3*/ proctype If_Never_UnlessAfter_(                                  If_Never_UnlessAfter_()
                          _enabled, _fulfilled, _discharged : boolean )
          /*      LTL: G(e*p0 -> X(G~f + ~fU(~f*d)) */
          import _enabled, _fulfilled, _discharged
          monitor ENABLED: PHASE( _enabled, ~_fulfilled* _discharged )             ENABLED
          monitor S: Always_( ~_fulfilled + ~ENABLED.$ )                                 S
          end If_Never_UnlessAfter_()

/*P2m.3*/ proctype If_mealyNever_UnlessAfter_(                         If_mealyNever_UnlessAfter_()
                          _enabled, _fulfilled, _discharged : boolean )
          import _enabled, _fulfilled, _discharged
          monitor ENABLED: PHASE( _enabled, ~_fulfilled* _discharged )             ENABLED
          monitor S: mealyAlways_( ~_fulfilled + ~ENABLED.$ )                            S
          end If_mealyNever_UnlessAfter_()

/*P2.4*/ proctype If_Always_( _enabled, _fulfilled : boolean )                    If_Always_()
          /*      LTL: G(e -> XGf) */
          import _enabled, _fulfilled
          monitor ENABLED: PHASE( _enabled, false )                                ENABLED
          monitor S: Always_( _fulfilled + ~ENABLED.$ )                                  S
          end If_Always_()

/*P2m.4*/ proctype If_mealyAlways_( _enabled, _fulfilled : boolean )           If_mealyAlways_()
          import _enabled, _fulfilled
          monitor ENABLED: PHASE( _enabled, false )                                ENABLED
          monitor S: mealyAlways_( _fulfilled + ~ENABLED.$ )                             S
          end If_mealyAlways_()

/*P2.5*/ proctype If_Never_( _enabled, _fulfilled : boolean )                       If_Never_()
          /*      LTL: G(e -> X(G~f)) */
          import _enabled, _fulfilled
          monitor ENABLED: PHASE( _enabled, false )                                ENABLED
          monitor S: Always_( ~_fulfilled + ~ENABLED.$ )                                 S
          end If_Never_()

/*P2m.5*/ proctype If_mealyNever_( _enabled, _fulfilled : boolean )             If_mealyNever_()
          import _enabled, _fulfilled
          monitor ENABLED: PHASE( _enabled, false )                                ENABLED
          monitor S: mealyAlways_( ~_fulfilled + ~ENABLED.$ )                            S
          end If_mealyNever_()
```

DePalma-Glaser-Kurshan-Wesley 1-5-14-1

QRY.h                                                              CONSTRAINTS

```
/*P3.1*/ proctype Never_Unless_( _fulfilled, _discharged : boolean )              Never_Unless_()
    /*      LTL: G~f + ~fUd [WEAK UNTIL] */
    import _fulfilled, _discharged
    monitor DISCHARGED: PHASE( _discharged, false )                                DISCHARGED
    monitor S: Always_( ~_fulfilled + _discharged + DISCHARGED.$ )                          S
    end Never_Unless_()

/*P3m.1*/ proctype mealyNever_Unless_( _fulfilled, _discharged : boolean )        mealyNever_Unless_()
    import _fulfilled, _discharged
    monitor DISCHARGED: PHASE( _discharged, false )                                DISCHARGED
    monitor S: mealyAlways_( ~_fulfilled + _discharged + DISCHARGED.$ )                     S
    end mealyNever_Unless_()

/*P3.2*/ proctype Always_UnlessAfter_( _fulfilled, _discharged : boolean )        Always_UnlessAfter_()
    /*      LTL: Gf + fU(f*d)       [WEAK UNTIL] */
    import _fulfilled, _discharged
    monitor DISCHARGED: PHASE( _fulfilled*_discharged, false )                     DISCHARGED
    monitor S: Always_( _fulfilled + DISCHARGED.$ )                                         S
    end Always_UnlessAfter_()

/*P3m.2*/ proctype mealyAlways_UnlessAfter_(                                      mealyAlways_UnlessAfter_()
                        _fulfilled, _discharged : boolean )
    import _fulfilled, _discharged
    monitor DISCHARGED: PHASE( _fulfilled*_discharged, false )                     DISCHARGED
    monitor S: mealyAlways_( _fulfilled + DISCHARGED.$ )                                    S
    end mealyAlways_UnlessAfter_()

/*P3.3*/ proctype Never_UnlessAfter_( _fulfilled, _discharged : boolean )         Never_UnlessAfter_()
    /*      LTL: G~f + ~fU(~f*d)    [WEAK UNTIL] */
    import _fulfilled, _discharged
    monitor DISCHARGED: PHASE( ~_fulfilled*_discharged, false )                    DISCHARGED
    monitor S: Always_( ~_fulfilled + DISCHARGED.$ )                                        S
    end Never_UnlessAfter_()

/*P3m.3*/ proctype mealyNever_UnlessAfter_(                                       mealyNever_UnlessAfter_()
                        _fulfilled, _discharged : boolean )
    import _fulfilled, _discharged
    monitor DISCHARGED: PHASE( ~_fulfilled*_discharged, false )                    DISCHARGED
    monitor S: mealyAlways_( ~_fulfilled + DISCHARGED.$ )                                   S
    end mealyNever_UnlessAfter_()
```

DePalma-Glaser-Kurshan-Wesley 1-5-14-1

QRY.h                                                    EVE.. .UALITY PROPERTIES

```
/* INVARIANT/EVENTUALITY HYBRIDS
     Constructs incorporating STRONG UNTIL
*/

/*P6.1*/ proctype If_Never_Until_( _i : integer; _enabled, _fulfilled, _discharged : boolean )If_Never_Until_()
           /*    LTL: G(e*p0 -> X(~fUd)) [PHASE-relative STRONG UNTIL] */
     import .s, _enabled, _fulfilled, _discharged
     recur   ~G.ENABLED.$*(.s:_i)
     monitor G: If_Always_Unless_( _enabled*(.s:_i), ~_fulfilled, _discharged )                G
     end If_Never_Until_()

/*P6m.1*/ proctype If_mealyNever_Until_(                                          If_mealyNever_Until_()
                                  _i : integer; _enabled, _fulfilled, _discharged : boolean )
     import .s, _enabled, _fulfilled, _discharged
     recur   ~G.ENABLED.$*(.s:_i)
     monitor G: If_mealyAlways_Unless_(                                                       G
                          _enabled*(.s:_i), ~_fulfilled, _discharged )
     end If_mealyNever_Until_()

/*P6.2*/ proctype If_Always_UntilAfter_(                                          If_Always_UntilAfter_()
                                  _i : integer; _enabled, _fulfilled, _discharged : boolean )
           /*    LTL: G(e*p0 -> X(fU(f*d))) */
     import .s, _enabled, _fulfilled, _discharged
     recur   ~G.ENABLED.$*(.s:_i)
     monitor G: If_Always_UnlessAfter_( _enabled*(.s:_i), _fulfilled, _discharged )           G
     end If_Always_UntilAfter_()

/*P6m.2*/ proctype If_mealyAlways_UntilAfter_(                              If_mealyAlways_UntilAfter_()
                                  _i : integer; _enabled, _fulfilled, _discharged : boolean )
     import .s, _enabled, _fulfilled, _discharged
     recur   ~G.ENABLED.$*(.s:_i)
     monitor G: If_mealyAlways_UnlessAfter_( _enabled*(.s:_i), _fulfilled, _discharged )      G
     end If_mealyAlways_UntilAfter_()

/*P6.3*/ proctype If_Never_UntilAfter_( _i : integer; _enabled, _fulfilled, _discharged If_Never_UntilAfter_()
           /*    LTL: G(e*p0 -> X(~fU(~f*d))) */
     import .s, _enabled, _fulfilled, _discharged
     recur   ~G.ENABLED.$*(.s:_i)
     monitor G: If_Never_UnlessAfter_( _enabled*(.s:_i), _fulfilled, _discharged )            G
     end If_Never_UntilAfter_()

/*P6m.3*/ proctype If_mealyNever_UntilAfter_(                                If_mealyNever_UntilAfter_()
                                  _i : integer; _enabled, _fulfilled, _discharged : boolean )
     import .s, _enabled, _fulfilled, _discharged
     recur   ~G.ENABLED.$*(.s:_i)
     monitor G: If_mealyNever_UnlessAfter_( _enabled*(.s:_i), _fulfilled, _discharged )       G
     end If_mealyNever_UntilAfter_()
```

DePalma-Glaser-Kurshan-Wesley 1-5-14-1

QRY.h                                               EVE,  JALITY PROPERTIES

```
/*P7.1*/ proctype Never_Until_( _i : integer; _fulfilled, _discharged : boolean )      Never_Until_()
         /*      LTL: ~fUd        [STRONG UNTIL]
                = Never_(f)^^AssumeNever_(d)#, checked as an EVENTUALITY
         */
         import .s, _fulfilled, _discharged
         kill    _discharged*(.s:_i)
         monitor G: Always_( ~_fulfilled + ~(.s:_i) )                                              G
         end Never_Until_()

/*P7m.1*/ proctype mealyNever_Until_( _i : integer; _fulfilled, _discharged : boolean )  mealyNever_Until_()
         /*       = mealyNever_(f)^^AssumeNever_(d)#, checked as an EVENTUALITY */
         import .s, _fulfilled, _discharged
         kill    _discharged*(.s:_i)
         monitor G: mealyAlways_( ~_fulfille + ~(.s:_i) )                                          G
         end mealyNever_Until_()

/*P7.2*/ proctype Always_UntilAfter_( _i : integer; _fulfilled, _discharged : boolean )  Always_UntilAfter_()
         /*      LTL: fU(f*d)     [STRONG UNTIL]
                = Always_(f)^^AssumeNever_(f*d)#, checked as an EVENTUALITY
         */
         import .s, _fulfilled, _discharged
         kill    _fulfilled*_discharged*(.s:_i)
         monitor G: Always_( _fulfilled + ~(.s:_i) )                                               G
         end Always_UntilAfter_()

/*P7m.2*/ proctype mealyAlways_UntilAfter_( _i : integer; _fulfilled, _discharged   mealyAlways_UntilAfter_()
         /*       = mealyAlways_(f)^^AssumeNever_(f*d)#, checked as an EVENTUALITY */
         import .s, _fulfilled, _discharged
         kill    _fulfilled*_discharged*(.s:_i)
         monitor G: mealyAlways_( _fulfilled + ~(.s:_i) )                                          G
         end mealyAlways_UntilAfter_()

/*P7.3*/ proctype Never_Until_( _i : integer; _fulfilled, _discharged : boolean )      Never_Until_()
         /*      LTL: ~fUd        [STRONG UNTIL]
                = Never_(f)^^AssumeNever_(d)#, checked as an EVENTUALITY
         */
         import .s, _fulfilled, _discharged
         kill    _discharged*(.s:_i)
         monitor G: Always_( ~_fulfilled + ~(.s:_i) )                                              G
         end Never_Until_()
```

DePalma-Glaser-Kurshan-Wesley 1-5-14-1

QRY.h                                              EVE     UALITY PROPERTIES

```
/*P7m.3*/ proctype mealyNever_Until_( _i : integer; _fulfilled, _discharged : boolean )  mealyNever_Until_()
             /*     = mealyNever_(f)∧AssumeNever_(d)#, checked as an EVENTUALITY */
          import   .s, _fulfilled, _discharged
          kill     _discharged*(.s:_i)
          monitor G: mealyAlways_( ~_fulfilled + ~(.s:_i) )                                            G
          end mealyNever_Until_()

/*P7.4*/ proctype Never_UntilAfter_( _i : integer; _fulfilled, _discharged : boolean )   Never_UntilAfter_()
             /*     LTL: ~fU(~f*d)   [STRONG UNTIL]
                    = Always_(~f)∧AssumeNever_(~f*d)#, checked as an EVENTUALITY
                */
          import   .s, _fulfilled, _discharged
          kill     ~_fulfilled*_discharged*(.s:_i)
          monitor G: Always_( ~_fulfilled + ~(.s:_i) )                                                G
          end Never_UntilAfter_()

/*P7m.4*/ proctype mealyNever_UntilAfter_( _i : integer; _fulfilled, _discharged : boolean )Never_UntilAfter_()
             /*     = mealyAlways_(~f)∧AssumeNever_(~f*d)#, checked as an EVENTUALITY */
          import   .s, _fulfilled, _discharged
          kill     ~_fulfilled*_discharged*(.s:_i)
          monitor G: mealyAlways_( ~_fulfilled + ~(.s:_i) )                                           G
          end mealyNever_UntilAfter_()
```

DePalma-Glaser-Kurshan-Wesley 1-5-14-1

QRY.h                                                                 EVE UALITY PROPERTIES

/* INVARIANT-FREE EVENTUALITY PROPERTIES (L-automata) */

```
/*C1.2*/ proctype Eventually_( _fulfilled : boolean )                     Eventually_()
            /*      LTL: Ff
                        = AssumeNever_(f) checked as an EVENTUALITY
            */
        import _fulfilled
        kill   _fulfilled       /*truncates upon '_fulfilled'*/
        end Eventually_()

/*C1.3*/ proctype Eventually_Unless_( _fulfilled, _discharged : boolean ) Eventually_Unless_()
            /*      LTL: Ff + Fd
                        = AssumeNever_(f+d) checked as an EVENTUALITY
            */
        import _fulfilled, _discharged
        kill   _fulfilled + _discharged
        end Eventually_Unless_()

/*P12a.1*/ proctype IfEventuallyAlways_Eventually_(                       IfEventuallyAlways_Eventually_()
                                         _i : integer; _enabled, _fulfilled: boolean )
            /*      LTL: G(FGe -> GFf)    [WEAK LIVENESS]
                        = Repeatedly_(~e+f)
            */
        import .s, _enabled, _fulfilled    recur (~_enabled + _fulfilled)*(.s:_i)
        end IfEventuallyAlways_Eventually_()

/*P12a.2*/ proctype IfEventuallyAlways_Repeatedly_(                       IfEventuallyAlways_Repeatedly_()
                                         _i : integer; _enabled, _fulfilled: boolean )
            /*      LTL: G(FGe -> GFf)    [WEAK LIVENESS]
                        = Repeatedly_(~e+f)
            */
        import .s, _enabled, _fulfilled    recur (~_enabled + _fulfilled)*(.s:_i)
        end IfEventuallyAlways_Repeatedly_()
```

DePalma-Glaser-Kurshan-Wesley 1-5-14-1

QRY.h  EVENTUALITY PROPERTIES

```
/*P12.1*/ proctype IfRepeatedly_Eventually_( _i : integer; _enabled, _fulfilled : IfRepeatedly_Eventually_()
          /*    LTL: G(GFe -> Ff)
                = IfRepeatedly_Repeatedly_(e,f)
          */
    import .s, _enabled, _fulfilled
    recur   _fulfilled*(.s:_i)              /*Recurringly _fulfilled, or ..*/
    monitor FG: EventuallyAlways_(_i, -_enabled)    /*finally not _enabled*/           FG
    end IfRepeatedly_Eventually_()

/*P12.2*/ proctype IfEventuallyAlways_EventuallyAlways_( IfEventuallyAlways_EventuallyAlways_()
                                                        _i : integer; _enabled, _fulfilled : boolean )
          /*    LTL: G(FGe -> FGf)
                = IfRepeatedly_Repeatedly_(-f,-e)
          */
    import .s, _enabled, _fulfilled
    recur   -_fulfilled*(.s:_i)             /*Recurringly -_fulfilled, or ..*/
    monitor FG: EventuallyAlways_(_i, _enabled)    /*finally _enabled*/                FG
    end IfEventuallyAlways_EventuallyAlways_()

/*P6a.1*/ proctype If_Eventually_Unless_(                              If_Eventually_Unless_()
                          _i : integer; _enabled, _fulfilled, _discharged : boolean )
          /*    LTL: G(e*p0 -> XF(f+d))
                = If_Eventually_(e,f+d)
          */
    import .s, _enabled, _fulfilled, _discharged
    recur   -ENABLED.$*(.s:_i)
    monitor ENABLED: PHASE( _enabled*(.s:_i), _fulfilled + _discharged )       ENABLED
    end If_Eventually_Unless_()

/*P8.1*/ proctype If_EventuallyAlways_( _i : integer; _enabled, _fulfilled : boolean ) If_EventuallyAlways_()
          /*    LTL: G(e*p0 -> FGf)
                = If_EventuallyAlways_Unless_(e,f,false)
          */
    import .s, _enabled, _fulfilled
    monitor ENABLED: PHASE( _enabled*(.s:_i), _discharged )                    ENABLED
    monitor SL: IfRepeatedly_Repeatedly_(_i, ENABLED.$*-_fulfilled, _discharged)  SL
    end If_EventuallyAlways_()

/*P9.1*/ proctype If_Repeatedly_( _i : integer; _enabled, _fulfilled : boolean )   If_Repeatedly_()
          /*    LTL: G(e -> GFf)
                = If_Repeatedly_Unless_(e,f,false)
          */
    import .s, _enabled, _fulfilled
    monitor ENABLED: PHASE( _enabled*(.s:_i), false )                          ENABLED
    monitor SL: IfRepeatedly_Repeatedly_(_i, ENABLED.$, _fulfilled )           SL
    end If_Repeatedly_()
```

—39—

DePalma-Glaser-Kurshan-Wesley 1-5-14-1

QRY.h                                                         CONSTRAINTS

/* GENERAL STATE INVARIANTS */

```
/*C1.1*/ proctype AssumeAlways_( _fulfilled : boolean )                  AssumeAlways_()
            /*       = AssumeNever_(~f) */
         import _fulfilled
         kill   -_fulfilled       /*truncates upon '-_fulfilled'*/
         end AssumeAlways_()

/*C2.1*/ proctype If_AssumeNever_Unless_(                        If_AssumeNever_Unless_()
                           _enabled, _fulfilled, _discharged : boolean )
            /*       = If_AssumeAlways_Unless_(e,-f,d) */
         import _enabled, _fulfilled, _discharged
         kill    ENABLED.$*-_discharged*_fulfilled
         monitor ENABLED: PHASE( _enabled, _discharged )                 ENABLED
         end If_AssumeNever_Unless_()

/*C2.2*/ proctype If_AssumeAlways_UnlessAfter_(                  If_AssumeAlways_UnlessAfter_()
                           _enabled, _fulfilled, _discharged : boolean )
            /*       = If_AssumeAlways_Unless_(e,f,f*d) */
         import _enabled, _fulfilled, _discharged
         kill    ENABLED.$*-_fulfilled
         monitor ENABLED: PHASE( _enabled, _fulfilled*_discharged )      ENABLED
         end If_AssumeAlways_UnlessAfter_()

/*C2.3*/ proctype If_AssumeNever_UnlessAfter_(                   If_AssumeNever_UnlessAfter_()
                           _enabled, _fulfilled, _discharged : boolean )
            /*       = If_AssumeAlways_Unless_(e,-f,-f*d) */
         import _enabled, _fulfilled, _discharged
         kill    ENABLED.$*_fulfilled
         monitor ENABLED: PHASE( _enabled, -_fulfilled*_discharged )     ENABLED
         end If_AssumeNever_UnlessAfter_()

/*C2.4*/ proctype If_AssumeAlways_( _enabled, _fulfilled : boolean )     If_AssumeAlways_()
            /*       = If_AssumeAlways_Unless_(e,f,false) */
         import _enabled, _fulfilled
         kill    ENABLED.$*-_fulfilled
         monitor ENABLED: PHASE( _enabled, false )                       ENABLED
         end If_AssumeAlways_()

/*C2.5*/ proctype If_AssumeNever_( _enabled, _fulfilled : boolean )      If_AssumeNever_()
            /*       = If_AssumeAlways_Unless_(e,-f,false) */
         import _enabled, _fulfilled
         kill    ENABLED.$*_fulfilled
         monitor ENABLED: PHASE( _enabled, false )                       ENABLED
         end If_AssumeNever_()
```

DePalma-Glaser-Kurshan-Wesley 1-5-14-1

QRY.h                                                        CONSTRAINTS

```
/*C3.1*/ proctype AssumeNever_Unless_( _fulfilled, _discharged : boolean )      AssumeNever_Unless_()
         /*      = AssumeAlways_Unless_(~f,d) */
         import _fulfilled, _discharged
         kill   ~DISCHARGED.$*-_discharged*_fulfilled
         monitor DISCHARGED: PHASE( _discharged, false )                         DISCHARGED
         end AssumeNever_Unless_()

/*C3.2*/ proctype AssumeAlways_UnlessAfter_(                                    AssumeAlways_UnlessAfter_()
                        _fulfilled, _discharged : boolean )
         /*      = AssumeAlways_Unless_(f,f*d) */
         import _fulfilled, _discharged
         kill   ~DISCHARGED.$*-_fulfilled
         monitor DISCHARGED: PHASE( _fulfilled*_discharged, false )              DISCHARGED
         end AssumeAlways_UnlessAfter_()

/*C3.3*/ proctype AssumeNever_UnlessAfter_(                                     AssumeNever_UnlessAfter_()
                        _fulfilled, _discharged : boolean )
         /*      = AssumeAlways_Unless_(-f,-f*d) */
         import _fulfilled, _discharged
         kill   ~DISCHARGED.$*_fulfilled
         monitor DISCHARGED: PHASE( -_fulfilled*_discharged, false )             DISCHARGED
         end AssumeNever_UnlessAfter_()
```

DePalma-Glaser-Kurshan-Wesley 1-5-14-1

QRY.h                                                                    CONSTRAINTS

/* EVENTUALITY CONSTRAINTS */

/*P8a.1*/ proctype AssumeRepeatedly_( _fulfilled : boolean )              AssumeRepeatedly_()
```
          /*      = EventuallyAlways_(~f)# */
    import  _fulfilled
    stvar   $ : boolean      init $ := {0..RETURNTOINIT}    cyset $=1
    asgn    $ → ~_fulfilled
    end AssumeRepeatedly_()
```

/*P8a.2*/ proctype IfEventuallyAlways_AssumeEventually_(   IfEventuallyAlways_AssumeEventually_()
```
                                          _enabled, _fulfilled : boolean )
          /*      = EventuallyAlways_(e*~f)# */
    import  _enabled, _fulfilled
    stvar   $ : boolean      init $ := {0..RETURNTOINIT}    cyset $=1
    asgn    $ → _enabled*~_fulfilled
    end IfEventuallyAlways_AssumeEventually_()
```

/*P8a.3*/ proctype IfEventuallyAlways_AssumeRepeatedly_(   IfEventuallyAlways_AssumeRepeatedly_()
```
                                          _enabled, _fulfilled : boolean )
          /*      = EventuallyAlways_(e*~f)# */
    import  _enabled, _fulfilled
    stvar   $ : boolean      init $ := {0..RETURNTOINIT}    cyset $=1
    asgn    $ → _enabled*~_fulfilled
    end IfEventuallyAlways_AssumeRepeatedly_()
```

/*P12a.3*/ proctype AssumeEventuallyAlways_( _fulfilled: boolean )        AssumeEventuallyAlways_()
```
          /*      = Repeatedly_(~f)# */
    import  _fulfilled       recur  ~_fulfilled
    end AssumeEventuallyAlways_()
```

/*C12.1*/ proctype IfRepeatedly_AssumeEventually_(                        IfRepeatedly_AssumeEventually_()
```
                                          _enabled, _fulfilled : boolean )
          /*      = IfRepeatedly_AssumeRepeatedly_(e,f) */
    import  _enabled, _fulfilled
    macro   DS:= IfRepeatedly_AssumeEventually_.s
    recur   _enabled*(DS:0)                           /* eventually always not _enabled */
    stvar   $ : boolean      init $ := {0..RETURNTOINIT}    cyset $=1
    asgn    $ → ~_fulfilled*(DS:1)
    proc    s: DirectSum(2)                           /* or */                              s
    /*monitor    FG: EventuallyAlways_(~_fulfilled*(DS:1))    /* repeatedly fulfilled */
    end IfRepeatedly_AssumeEventually_()
```

/*C12.2*/ proctype IfEventuallyAlways_AssumeEventuallyAlways_(  IfEventuallyAlways_AssumeEventuallyAlways_()
```
                                          _enabled, _fulfilled : boolean )
          /*      = IfRepeatedly_AssumeRepeatedly_(~f,~e) */
    import  _enabled, _fulfilled
    macro   DS:= IfEventuallyAlways_AssumeEventuallyAlways_.s
    recur   ~_fulfilled*(DS:0)                        /* eventually always _fulfilled */
    stvar   $ : boolean      init $ := {0..RETURNTOINIT}    cyset $=1
    asgn    $ → _enabled*(DS:1)
```

*Page 26 of QRY.h*

DePalma-Glaser-Kurshan-Wesley 1-5-14-1

QRY.h                                                                      CONSTRAINTS proc   s: DirectSum(2)                        /* or */                              s
/\*monitor       FG: EventuallyAlways_(_enabled\*(DS:1))   /\* repeatedly not _enabled \*/
end IfEventuallyAlways_AssumeEventuallyAlways_()

DePalma-Glaser-Kurshan-Wesley 1-5-14-1

QRY.h                                                                    CONSTRAINTS

```
/*C6.1*/ proctype If_AssumeNever_Until_(                          If_AssumeNever_Until_()
                         _enabled, _fulfilled, _discharged : boolean )
            /*     = If_AssumeAlways_Until_(e,-f,d) */
         import _enabled, _fulfilled, _discharged
         cyset   {G.ENABLED.$:=1}
         monitor G: If_AssumeAlways_Unless_( _enabled, -_fulfilled, _discharged )         G
         end If_AssumeNever_Until_()

/*C6.2*/ proctype If_AssumeAlways_UntilAfter_(                    If_AssumeAlways_UntilAfter_()
                         _enabled, _fulfilled, _discharged : boolean )
            /*     = If_AssumeAlways_Until_(e,f,f*d) */
         import _enabled, _fulfilled, _discharged
         cyset   {G.ENABLED.$:=1}
         monitor G: If_AssumeAlways_UnlessAfter_( _enabled, _fulfilled, _discharged )      G
         end If_AssumeAlways_UntilAfter_()

/*C6.3*/ proctype If_AssumeNever_UntilAfter_(                     If_AssumeNever_UntilAfter_()
                         _enabled, _fulfilled, _discharged : boolean )
            /*     = If_AssumeAlways_Until_(e,-f,-f*d) */
         import _enabled, _fulfilled, _discharged
         cyset   {G.ENABLED.$:=1}
         monitor G: If_AssumeNever_UnlessAfter_( _enabled, _fulfilled, _discharged )       G
         end If_AssumeNever_UntilAfter_()

/*C6.4*/ proctype If_AssumeEventually_(                           If_AssumeEventually_()
                         _enabled, _fulfilled : boolean )
            /*     = If_AssumeAlways_Until_(e,true,f) */
         import _enabled, _fulfilled
         cyset   {ENABLED.$:=1}
         monitor ENABLED: PHASE( _enabled, _fulfilled )                                    ENABLED
         end If_AssumeEventually_()

/*C6.5*/ proctype If_AssumeEventually_Unless_(                    If_AssumeEventually_Unless_()
                         _enabled, _fulfilled, _discharged : boolean )
            /*     = If_AssumeAlways_Until_(e,true,f+d) */
         import _enabled, _fulfilled, _discharged
         cyset   {ENABLED.$:=1}
         monitor ENABLED: PHASE( _enabled, _fulfilled + _discharged )                      ENABLED
         end If_AssumeEventually_Unless_()

/*C7.1*/ proctype AssumeNever_Until_( _fulfilled, _discharged : boolean )    AssumeNever_Until_()
            /*     = AssumeAlways_Until_(-f,d) */
         import _fulfilled, _discharged
         cyset   {G.DISCHARGED.$:=0}
         monitor G: AssumeNever_Unless_( _fulfilled, _discharged )                         G
         end AssumeNever_Until_()
```

-44-

QRY.h                                                                              CONSTRAINTS

```
/*C7.2*/ proctype AssumeAlways_UntilAfter_(                          AssumeAlways_UntilAfter_()
                           _fulfilled, _discharged : boolean )
         /*      = AssumeAlways_Until_(f,f*d) */
         import _fulfilled, _discharged
         cyset  {G.DISCHARGED.$:=0}
         monitor G: AssumeAlways_UnlessAfter_( _fulfilled, _discharged )              G
         end AssumeAlways_UntilAfter_()

/*C7.3*/ proctype AssumeNever_UntilAfter_( _fulfilled, _discharged : boolean )AssumeNever_UntilAfter_()
         /*      = AssumeAlways_Until_(~f,~f*d) */
         import _fulfilled, _discharged
         cyset  {G.DISCHARGED.$:=0}
         monitor G: AssumeNever_UnlessAfter_( _fulfilled, _discharged )               G
         end AssumeNever_UntilAfter_()

/*C7.4*/ proctype AssumeEventually_( _fulfilled : boolean )          AssumeEventually_()
         /*      = AssumeAlways_Until_(true,f) */
         import _fulfilled
         cyset  {DISCHARGED.$:=0}
         monitor DISCHARGED: PHASE( _fulfilled, false )                       DISCHARGED
         end AssumeEventually_()

/*C7.5*/ proctype AssumeEventually_Unless_(                          AssumeEventually_Unless_()
                           _fulfilled, _discharged : boolean )
         /*      = AssumeAlways_Until_(true,f+d) */
         import _fulfilled, _discharged
         cyset  {DISCHARGED.$:=0}
         monitor DISCHARGED: PHASE( _fulfilled + _discharged, false )         DISCHARGED
         end AssumeEventually_Unless_()

/*C8.1*/ proctype If_AssumeEventuallyAlways_(                        If_AssumeEventuallyAlways_()
                           _enabled, _fulfilled : boolean )
         /*      = If_AssumeEventuallyAlways_Unless_(e,f,false) */
         import _enabled, _fulfilled
         recur  ENABLED.$*- _fulfilled
         monitor ENABLED: PHASE( _enabled, false )                            ENABLED
         end If_AssumeEventuallyAlways_()

/*C9.1*/ proctype If_AssumeRepeatedly_( _enabled, _fulfilled : boolean )     If_AssumeRepeatedly_()
         /*      = If_AssumeRepeatedly_Unless_(e,f,false) */
         import _enabled, _fulfilled
         stvar  $ : boolean    init $ := {0..RETURNTOINIT}   cyset $=1
         asgn   $ → ENABLED.$*- _fulfilled
         monitor ENABLED: PHASE( _enabled, false )                            ENABLED
         /*monitor    FG: EventuallyAlways_(ENABLED.$*- _fulfilled )*/
         end If_AssumeRepeatedly_()
```

We claim:

1. An apparatus comprising:
   a fixed predetermined library having a finite set of templates, each template having one or more than one fixed number of entry spaces, the totality of templates in the library defining a set of behavioral attribute types of any system for which the set of behavioral attribute types can be expressed in terms of a succession of transitions from one model state to a succeeding model state; and
   means for filling said one or more than one fixed number of entry spaces of a selected template with one expression per entry space to form a filled template that defines a specific behavioral attribute of a particular such system.

2. The apparatus of claim 1 further comprising means for transforming said filled template into an automaton.

3. The apparatus of claim 2 wherein said finite set of templates comprises a set of templates which is sufficient to define any behavioral attribute that may be defined by an automaton.

4. The apparatus of claim 3 wherein said finite set of templates comprises a set of property templates and a set of constraint templates.

5. The apparatus of claim 1 further comprising a subroutine executable to transform said filled template into an automaton.

6. The apparatus of claim 5 wherein said one or more than one fixed number of entry spaces has an associated qualifier, said associated qualifier being at least a selected one of enabling qualifiers (A), fulfilling qualifiers (B), and discharging qualifiers (C).

7. The apparatus of claim 6 wherein said one or more than one fixed number of entry spaces includes an entry space (X) for accepting an expression defining a fulfilling condition, an entry space (Y) for accepting an expression defining an enabling condition, and an entry space (Z) for accepting an expression defining a discharging condition, said fulfilling condition defining an event required by a system behavioral attribute, said enabling condition defining a precondition for starting a check of said fulfilling condition, and said discharging condition defining a condition after which said fulfilling condition is no longer required.

8. The apparatus of claim 1 wherein said means for filling comprises a processor operable to present a set of template query screens to a designer through a graphical interface.

9. The apparatus of claim 8 wherein said set of template query screens are operable to receive said at least one expression from said designer.

10. The apparatus of claims 7 or 9 wherein said selected template has a format comprising AYBXCZ.

11. The apparatus of claims 7 or 9 wherein said enabling qualifiers (A) are selected from the group comprising AFTER, and IFREPEATEDLY.

12. The apparatus of claims 7 or 9 wherein said fulfilling qualifiers (B) are selected from the group comprising ALWAYS, NEVER, EVENTUALLY, and EVENTUALLY ALWAYS.

13. The apparatus of claims 7 or 9 wherein said discharging qualifiers (C) are selected from the group comprising UNLESS, UNTIL, UNLESS AFTER, and UNTIL AFTER.

14. The apparatus of claims 7 or 9 wherein said selected template includes a qualifier which qualifies said at least one expression, said qualifier being selected from the group comprising AFTER, IF REPEATEDLY, ALWAYS, NEVER, EVENTUALLY, EVENTUALLYALWAYS, UNLESS, UNTIL, UNLESSAFTER, UNTILAFTER, and CLOCK.

15. The apparatus of claim 1 wherein said set of templates comprises a set of property templates and a set of constraint templates.

16. The apparatus of claim 15 wherein said set of property templates and said set of constraint templates define complementary behaviors, when filled.

17. The apparatus of claim 9 wherein said finite set of templates are stored in a memory.

18. The apparatus of claim 1 further comprising means for presenting a set of said finite set of templates to a designer.

19. An apparatus for defining a system design specification for any system the behavioral attributes of which can be expressed in terms a succession of transitions from one system model state to a succeeding model state, the apparatus comprising:
   means for selecting a template from a fixed predetermined library comprising a finite set of templates, said selected template having a set of qualifiers and a set of a fixed number of entry spaces, each qualifier being associated with an entry space, the totality of templates in the library defining a set of behavioral attribute types of any such system; and
   means for inputting at least one system expression into said set of entry spaces of said selected template, one expression per entry space, said at least one system expression and said associated qualifiers, in combination, defining a specific behavioral attribute of a particular such system.

20. The apparatus of claim 19 wherein said finite set of templates includes a set of property templates and a set of constraint templates.

21. The apparatus of claim 19 wherein each said template has a set of qualifiers comprising a fulfilling qualifier (B), an enabling qualifier (A) and a discharging qualifier (C).

22. The apparatus of claim 19 wherein said at least one system expression further comprises an enabling condition (Y) which defines a precondition for starting a check of said fulfilling condition (X), and a discharging condition (Z) which defines a condition after which said fulfilling condition (X) is no longer required.

23. The apparatus of claim 22 wherein each selected template has the form AYBXCZ, wherein AY and CZ are optional.

24. The apparatus of claims 19 or 23 wherein said means for inputting is operable to present a set of queries through an interface to enable a designer to input to said one or more than one fixed number of entry spaces expressions representing said fulfilling condition (X), said enabling conditioning (Y) and said discharging condition (Z).

25. The apparatus of claim 24 wherein said set of queries are stored in a memory.

26. The apparatus of claim 25 wherein said selected template is a system property template.

27. The apparatus of claim 26 wherein said enabling qualifier (A) of said selected template is a qualifier selected from the group comprising AFTER, and IF REPEATEDLY.

28. The apparatus of claim 26 wherein said fulfilling qualifier (B) of said selected template is a qualifier selected from the group comprising ALWAYS, NEVER, EVENTUALLY, and EVENTUALLY ALWAYS.

29. The apparatus of claim 26 wherein said discharging qualifier (C) of said selected template is a qualifier selected from the group comprising UNLESS, UNTIL, UNLESS AFTER, and UNTIL AFTER.

30. The apparatus of claim 25 wherein said selected template is a system constraint template.

31. The apparatus of claim 30 wherein said enabling qualifier (A) of said selected template is a qualifier selected from the group comprising AFTER, and IF REPEATEDLY.

32. The apparatus of claim 30 wherein said fulfilling qualifier (B) of said selected template is a qualifier selected from the group comprising ASSUME ALWAYS, ASSUME NEVER, ASSUME EVENTUALLY, ASSUME EVENTUALLY ALWAYS, ALWAYS, NEVER, EVENTUALLY, EVENTUALLY ALWAYS.

33. The apparatus of claim 30 wherein said discharging qualifier (C) of a selected template is a qualifier selected from the group comprising UNLESS, UNTIL, UNLESS AFTER, and UNTIL AFTER.

34. An apparatus for generating a design specification for a model of any system the behavioral attributes of which can be expressed in terms of a succession of transitions from one system model state to a succeeding model state, the apparatus comprising:
  a fixed predetermined library comprising a finite set of templates, each template having a set of qualifiers, each qualifier having an associated entry blank, the totality of templates in the library defining a set of behavioral attribute types of any such system, the number of entry blanks in each template being a fixed number;
  means for inputting a system expression into each said associated entry blank, one system expression per entry blank, to form a filled template that defines a specific behavioral attribute of a particular such system, said system behavioral attribute being defined in terms of at least a selected one of fulfilling conditions which define events required by said system behavioral attribute, enabling conditions which define preconditions for starting a check of said fulfilling conditions, and discharging conditions which signify conditions after which said fulfilling conditions are no longer required; and
  means for transforming said filled template into an automaton.

35. The apparatus of claim 34 further comprising means for inputting said automaton to a testing tool.

36. The apparatus of claim 35 wherein said testing tool is a simulation tool.

37. The apparatus of claim 35 wherein said testing tool is a verification tool.

38. An apparatus for defining a design specification of any system the behaviors of which can be expressed in terms of a succession of transitions from one system model state to a succeeding model state, the apparatus comprising a fixed finite set of templates, the totality of templates defining a set of behavior types of any such system, each template having one or more than one fixed number of entry spaces for accepting one system expression per entry space comprising at least a selected one of fulfilling conditions which define events required by a system behavior, enabling conditions, and discharging conditions which signify conditions after which said fulfilling conditions are no longer required such that said template, when filled with said system expression, defines a specific behavior of a particular such system.

39. The apparatus of claim 38 wherein said finite set of templates comprises a set of property templates and a set of constraint templates.

40. The apparatus of claim 39 wherein said property templates have the same format as said constraint templates.

41. The apparatus of claim 40 wherein said system expression is expressed in terms of system variables and system inputs.

42. The apparatus of claim 41 wherein each said template of said finite set of templates comprises the same number of entry spaces.

43. The apparatus of claim 42 wherein said at least one entry space comprises a fulfilling condition entry space (X) for accepting one of said fulfilling conditions, an enabling condition entry space (Y) for accepting one of said enabling conditions, and a discharging condition entry space (Z) for accepting one of said discharging conditions.

44. The apparatus of claim 43 where said one or more than one fixed number of entry spaces is qualified by a qualifier.

45. The apparatus of claim 44 wherein said fulfilling condition entry space (X) is qualified by a first qualifier (A), said enabling condition entry space (Y) is qualified by a second qualifier (B), and said discharging condition entry space (Z) is qualified by a third qualifier (C).

46. The apparatus of claim 45 wherein each said template has the form BYAXCZ.

47. The apparatus of claim 46 wherein said inputs accepted into said fulfilling condition entry space (X), said enabling condition entry space (Y) and said discharging condition entry space (Z) are obtained through a set of query screens presented to a designer through an interface.

48. The apparatus of claim 44 wherein said finite set of templates are stored in a memory.

49. The apparatus of claim 48 wherein said qualifier is chosen from a set of qualifiers comprising AFTER, IF REPEATEDLY, EVENTUALLY, ASSUME EVENTUALLY, EVENTUALLY ALWAYS, ASSUME EVENTUALLY ALWAYS, UNLESS, UNTIL, UNLESS AFTER, UNTIL AFTER, and ALWAYS.

50. A method of defining a design specification for any system the behaviors of which can be expressed in terms of a succession of transitions from one model state to a succeeding model state, the method comprising the steps of:
  receiving a set of inputs, each input representing a parameter that describes a system attribute; and
  filling a set of templates, selected from a fixed predetermined finite template set, with information based on said set of inputs, each template having one or more than one fixed number of entry spaces, the totality of templates in the template set defining a set of behavior types of any such system, each template of said finite template set having a format for accepting a fixed number of said parameters that describe said system attributes, one parameter per entry space, such that each said filled template defines a specific behavioral attribute of a particular system.

51. A method comprising the steps of:
  retrieving a template from a fixed predetermined library comprising a finite set of templates, each template having one or more than one fixed number of entry spaces, the totality of templates in the library defining a set of behavioral attribute types of any system for which the set of behavioral attribute types can be expressed in terms of a succession of transitions from one model state to a succeeding model state; and
  filling said one or more than one fixed number of entry spaces of the retrieved template with at least one expression, one expression per entry space, to form a filled template that defines a specific behavioral attribute of a particular such system, said at least one expression comprising a fulfilling condition which defines at least one event required by said behavioral attribute of said system.

52. The method of claim 51 further comprising the step of transforming said filled template into an automaton.

53. The method of claim 52 wherein said finite set of templates comprises a set of templates which is sufficient to define any behavioral attribute that may be defined by an automaton.

54. The method of claim 53 wherein said finite set of templates comprises a set of property templates and a set of constraint templates.

55. The method of claim 51 wherein said at least one expression further comprises an optional enabling condition which defines a precondition for starting a check of said fulfilling condition, and an optional discharging condition which defines a condition after which said fulfilling condition is no longer required by said behavioral attribute of said system.

56. The method of claim 55 wherein said one or more than one fixed number of entry spaces includes an entry space (X) for accepting an expression defining a fulfilling condition, an optional entry space (Y) for accepting an expression defining an enabling condition, and an optional entry space (Z) for accepting an expression for defining a discharging condition.

57. The method of claim 51 wherein said selected template includes a qualifier which qualifies said at least one expression, said qualifier being selected from the group consisting of AFTER, IFREPEATEDLY, ALWAYS, NEVER, EVENTUALLY, EVENTUALLYALWAYS, UNLESS, UNTIL, UNLESSAFTER, UNTILAFTER, and CLOCK.

58. The method of claim 51 wherein said set of templates comprises a set of property templates and a set of constraint templates.

59. The method of claim 58 wherein said set of property templates and said set of constraint templates define complementary behaviors, when filled.

* * * * *